United States Patent
Mitamura et al.

(10) Patent No.: US 9,257,142 B2
(45) Date of Patent: Feb. 9, 2016

(54) HEAT-REACTIVE RESIST MATERIAL, LAYERED PRODUCT FOR THERMAL LITHOGRAPHY USING THE MATERIAL, AND METHOD OF MANUFACTURING A MOLD USING THE MATERIAL AND LAYERED PRODUCT

(75) Inventors: Yoshimichi Mitamura, Tokyo (JP); Kazuyuki Furuya, Tokyo (JP); Norikiyo Nakagawa, Tokyo (JP); Masatoshi Maeda, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 352 days.

(21) Appl. No.: 13/123,854

(22) PCT Filed: Oct. 13, 2009

(86) PCT No.: PCT/JP2009/067737
§ 371 (c)(1),
(2), (4) Date: Apr. 25, 2011

(87) PCT Pub. No.: WO2010/044400
PCT Pub. Date: Apr. 22, 2010

(65) Prior Publication Data
US 2011/0195142 A1 Aug. 11, 2011

(30) Foreign Application Priority Data

| Oct. 14, 2008 | (JP) | 2008-265640 |
| Jan. 19, 2009 | (JP) | 2009-008910 |
| Apr. 14, 2009 | (JP) | 2009-098065 |
| Aug. 14, 2009 | (JP) | 2009-188004 |

(51) Int. Cl.
*G11B 7/243* (2013.01)
*G11B 7/26* (2006.01)
(Continued)

(52) U.S. Cl.
CPC ............... *G11B 7/261* (2013.01); *B82Y 10/00* (2013.01); *B82Y 40/00* (2013.01); *G03F 7/0002* (2013.01); *Y10T 428/31504* (2015.04); *Y10T 428/31678* (2015.04)

(58) Field of Classification Search
CPC ...... G11B 7/261; G03F 7/0002; B82Y 10/00; B82Y 40/00
USPC ...................... 216/87; 430/322; 423/604, 605; 428/457, 698, 702
See application file for complete search history.

(56) References Cited

U.S. PATENT DOCUMENTS 5,049,355 A * 9/1991 Gennari et al. .............. 420/425
7,175,962 B2 * 2/2007 Kouchiyama et al. ..... 430/270.1
(Continued)

FOREIGN PATENT DOCUMENTS

| CN | 1573999 A | 2/2005 |
| CN | 1601694 A | 3/2005 |

(Continued)

OTHER PUBLICATIONS

International Search Report dated Jan. 19, 2010 in International Application No. PCT/JP2009/067737.
(Continued)

*Primary Examiner* — Amanda C Walke
(74) *Attorney, Agent, or Firm* — Birch, Stewart, Kolasch & Birch, LLP

(57) ABSTRACT

A heat-reactive resist material of the invention is characterized in that the boiling point of the fluoride of the element is 200° C. or more. By this means, it is possible to achieve the heat-reactive resist material having high resistance to dry etching using fluorocarbons to form a pattern with the deep groove depth.

36 Claims, 5 Drawing Sheets

(51) Int. Cl.
  *B82Y 10/00* (2011.01)
  *B82Y 40/00* (2011.01)
  *G03F 7/00* (2006.01)

(56) References Cited

U.S. PATENT DOCUMENTS

| | | | |
|---|---|---|---|
| 7,344,822 B2* | 3/2008 | Kouchiyama et al. | 430/270.1 |
| 7,560,220 B2* | 7/2009 | Kouchiyama et al. | 430/270.1 |
| 7,565,530 B2* | 7/2009 | Kwak et al. | 713/156 |
| 7,713,678 B2 | 5/2010 | Hosoda | |
| 8,206,892 B2* | 6/2012 | Keszler et al. | 430/270.1 |
| 2004/0170916 A1 | 9/2004 | Kouchiyama et al. | |
| 2004/0256762 A1 | 12/2004 | Ito et al. | |
| 2005/0045587 A1 | 3/2005 | Kawaguchi et al. | |
| 2005/0063289 A1 | 3/2005 | Tomiyama et al. | |
| 2005/0106508 A1 | 5/2005 | Shintani et al. | |
| 2007/0217322 A1 | 9/2007 | Hanaoka et al. | |
| 2008/0187861 A1 | 8/2008 | Meinders | |
| 2008/0213690 A1 | 9/2008 | Hosoda | |
| 2009/0196148 A1 | 8/2009 | Yusu et al. | |
| 2010/0075114 A1 | 3/2010 | Kurihara et al. | |
| 2010/0167015 A1 | 7/2010 | Kurihara et al. | |
| 2011/0027408 A1* | 2/2011 | Suzuki et al. | 425/471 |

FOREIGN PATENT DOCUMENTS

| | | |
|---|---|---|
| CN | 1945431 A | 4/2007 |
| CN | 1981336 A | 6/2007 |
| EP | 1 477 847 A1 | 11/2004 |
| JP | 60-98535 A | 6/1985 |
| JP | 3-127342 A | 5/1991 |
| JP | 8-45115 A | 2/1996 |
| JP | 9-115190 A | 5/1997 |
| JP | 2005-100526 A | 4/2005 |
| JP | 2005-100602 A | 4/2005 |
| JP | 2005-100608 A | 4/2005 |
| JP | 2005-332452 A | 12/2005 |
| JP | 2006-216220 A | 8/2006 |
| JP | 2007-144995 A | 6/2007 |
| JP | 2007-315988 A | 12/2007 |
| JP | 2008-517413 A | 5/2008 |
| JP | 2008-168610 A | 7/2008 |
| JP | 2008-299256 A | 12/2008 |
| JP | 2009-26393 A | 2/2009 |
| JP | 2009-181662 A | 8/2009 |
| JP | 2009-252323 A | 10/2009 |
| JP | 2010-26250 A | 2/2010 |
| JP | 2010-152105 A | 7/2010 |
| WO | WO 2005/112024 A1 | 11/2005 |
| WO | WO 2006/129565 A1 | 12/2006 |

OTHER PUBLICATIONS

Chinese Office Action, dated Feb. 3, 2015, for Chinese Application No. 201310011760.8.
Chart In—Sb obtained from <http://resource.npl.co.uk/mtdata/phdiagrams/insb.htm>, Search on Feb. 24, 2014 by Japan Patent Office.
Chart Ge—Sn obtained from <http://www.crct.polymtl.ca/fact/phase_diagram.php?file=Ge-Sn.jpg&dir=SGTE>, Search on Feb. 24, 2014 by Japan Patent Office.
Okamoto, "Co—In (Cobalt—Indium)," Journal of Phase Equilibria, vol. 18, No. 3, 1997, p. 315.
The Notification of Reasons for Rejection (including English translation), dated May 4, 2014, issued in the corresponding Japanese Patent Application No. 2012-247817.
The Notification of Reasons for Rejection (including English translation), dated May 4, 2014, issued in the corresponding Japanese Patent Application No. 2012-247818.
The Notification of Reasons for Rejection (including English translation), dated May 4, 2014, issued in the corresponding Japanese Patent Application No. 2012-247819.
Office Action issued Apr. 8, 2013, in Chinese Patent Application No. 20098014352.6.
Communication Pursuant to Article 94(3) EPC issued Jun. 25, 2012, in European Patent Application No. 09820578.4.
European Search Report issued May 16, 2012, in European Patent Application No. 09820578.4.
First Office Action issued Jul. 24, 2012, in Chinese Patent Application No. 200980141352.6.
Notification of Reasons for Rejection issued Sep. 11, 2012, in Japanese Patent Application No. 2010-533898, with English translation.
Office Action issued Jan. 3, 2013, in Taiwan Patent Application No. 098134816.

* cited by examiner

HEAT-REACTIVE RESIST MATERIAL, LAYERED PRODUCT FOR THERMAL LITHOGRAPHY USING THE MATERIAL, AND METHOD OF MANUFACTURING A MOLD USING THE MATERIAL AND LAYERED PRODUCT

TECHNICAL FIELD

The present invention relates to a heat-reactive resist material with high resistance to a dry etching processing using fluorocarbons, layered product for thermal lithography using the material and method of manufacturing a mold using the material and layered product.

BACKGROUND ART

In recent years, in the fields of semiconductor, optical/magnetic recording, etc., as demands for higher density, higher integration and others have increased, techniques have become essential for fine pattern processing of about several hundreds to tens of nanometers or less. Therefore, to achieve the fine pattern processing, elemental techniques of each process have been studied actively such as a mask, stepper, exposure and resist material.

For example, in the process of masking and stepper, studied are the technique of using a specific mask called the phase shift mask to provide the light with a phase difference, and increasing fine pattern processing precision by the effect of interference, the liquid immersing technique of filling a liquid into between the stepper lens and wafer, largely refracting the light passed through the lens, and thereby enabling the fine pattern processing, and the like. However, the former technique requires enormous cost to develop the mask, the latter technique requires expensive equipment, and thus, it is significantly difficult to reduce the manufacturing cost.

Meanwhile, many studies have proceeded also on the resist material. Currently, the most common resist material is the photoreactive organic resist (hereinafter, also referred to as a photoresist) that reacts by an exposure light source such as ultraviolet light, electron beam and X-rays (hereinafter, see Patent Document 1 and Non-patent Document 1).

In the laser light used in exposure, the intensity of the laser light focused by the lens generally shows the Gaussian distribution form as shown in FIG. 8. At this point, the spot diameter is defined by $1/e^2$. In general, the reaction of photoresist starts by absorbing energy represented by $E=h\nu$ (E: energy, h: Planck constant, $\nu$: wavelength). Accordingly, the reaction is not dependent on the intensity of the light significantly, and rather dependent on the wavelength of the light, and thus, the reaction occurs in the entire portion (exposed portion) irradiated with the light. Therefore, when the photoresist is used, the photoresist is faithfully exposed with respect to the spot diameter.

The method of using a photoreactive organic resist is an extremely useful method in forming fine patterns of about hundreds of nanometers, and since the photoresist using photoreaction is used, to form finer patterns, it is necessary to expose with a smaller spot than a pattern required in principle. Accordingly, it is indispensable to use a KrF laser, ArF laser or the like with short wavelengths as an exposure light source. However, these light source apparatuses are large-size and expensive, and are unsuitable from the viewpoint of reducing the manufacturing cost. Further, in the case of using the exposure light source of electron beam, X-rays or the like, since it is necessary to evacuate the exposure atmosphere to a vacuum state, using a vacuum chamber is required, and there are significant limitations from the viewpoint of the cost and increases in the size.

Meanwhile, when a substance is irradiated with the laser light having the distribution as shown in FIG. 8, the temperature of the substance also shows the same Gaussian distribution as the intensity distribution of the laser light (see FIG. 9). At this point, when a heat-reactive resist is used that is a resist reacting at some temperature or more, as shown in FIG. 9, since the reaction proceeds only in the portion becoming a predetermined temperature or more, it is made possible to expose the range smaller than the spot diameter. In other words, without shortening the wavelength of the exposure light source, it is possible to form the pattern finer than the spot diameter, and by using the heat-reactive resist, it is possible to reduce the effect of the wavelength of the exposure light source.

In the field of optical recording, the technique is reported that WOx, MoOx, other chalcogenide glass (Ag—As—S series) or the like is used as a heat-reactive resist, and exposed with a semiconductor laser or 476-nm laser to form the fine pattern (hereinafter, see Patent Document 2 and Non-patent Document 2). These optical disks used in the optical recording field are a generic name for media for applying laser light to the disk coated with the resist material and reading the information recorded in fine asperities provided on the disk surface, and as decreases the pitch between recoding units called the track pitch, the recording density increases, and the data capacity recordable per area increases. Therefore, to improve the recording density, studies are made on techniques for fine concavo-convex pattern processing using the resist material. However, the studies using the heat-reactive resist cope with the demand for narrowing the pitch of the pattern in the film surface direction (for improving the recording density of information), and there has been no demand for forming deep grooves in the film thickness direction. Meanwhile, in recent years, the demand for application using a pattern shape with a deep groove depth has increased in other fields. As the depth of the groove in the film thickness direction, the thickness of the film of the heat-reactive resist itself is the depth of the groove in the depth direction, and therefore, to form deep grooves, it is necessary to thicken the heat-reactive resist. However, by the film thickness increasing, uniformity in the film thickness direction by exposure loses, and as a result, there is the problem that the processing precision of the fine pattern degrades not only in the depth direction but also in the film surface direction.

Then, a technique of beforehand forming a film (hereinafter, also referred to as an etching layer) with a thickness corresponding to the groove depth desired to form under the heat-reactive resist film, and forming deep grooves in the film under the resist using the heat-reactive resist provided with a pattern shape by being exposed and developed as a mask is considered. Generally, to etch uniformly in the depth direction, processing by dry etching is used. For example, when $SiO_2$ is used for the etching layer, it is possible to perform dry etching using fluorocarbons. In the case of processing by dry etching, the resist material used as a mask is required to have resistance to dry etching of fluorocarbons as well as permitting the fine pattern processing. As described above, as an example of substituting the heat-reactive resist material researched in the field of optical recording, WOx and MoOx are reported previously. In these heat-reactive resists, when dry etching is performed using fluorocarbons, WOx that is disclosed has etching resistance only less than three times (a value obtained by dividing the etching rate of $SiO_2$ by the etching rate of WOx) that of $SiO_2$, and is insufficient as a mask material to form deep grooves (hereinafter, see Non-patent Document 3).

Meanwhile, layered product materials in which Ag, Cu and their compounds having relatively high dry etching resistance, and oxides (limited to part of materials among published materials) having dry etching resistance are used as heat-reactive resists are disclosed, and an etching layer is layered under the resist (hereinafter, see Patent Documents 3 and 4). In the former compounds, the resist material is sublimated using ultraviolet rays to form the pattern, and then, by performing dry etching, deep grooves are formed. However, in the layered product Ag (resist layer)/$As_3S_2$ (etching layer) disclosed in the Example, $As_3S_2$ is sublimated first by heating, and reaching the intended process is not achieved. Meanwhile, in the latter compounds, coagulation, core formation and decomposition actions are induced to the oxide material by heat, light or gas reaction and so on a sea-island pattern is formed, and then, by performing dry etching, deep grooves are formed. However, only a random sea-island structure can be formed, and it is difficult to control the pattern size of a fine pattern with uniform concavo-convex structure, line shapes and the like.

CITATION LIST

Patent Literature

Patent Literature 1: Japanese Unexamined Patent Publication No. 2007-144995
Patent Literature 2: Japanese Unexamined Patent Publication No. 2007-315988
Patent Literature 3: Japanese Unexamined Patent Publication No. S60-98535
Patent Literature 4: Japanese Unexamined Patent Publication No. 2008-168610

Non-Patent Literature

Non-Patent Literature 1: "Latest Resist Material" published by Johokiko Co., LTD. P. 59-P. 76
Non-Patent Literature 2: SPIE Vol. 3424 (1998) P. 20
Non-Patent Literature 3: The 19th Symposium on Phase Change Optical Information Storage (2007) P. 77
Non-Patent Literature 4: "Nanoimprint Application Examples" published by Johokiko Co., LTD. P. 611-P. 612

SUMMARY OF THE INVENTION

Technical Problem

The present invention was made in view of the above-mentioned problem, and it is an object of the invention to provide heat-reactive resist materials having high resistance to dry etching using fluorocarbons to form a pattern with a deep groove depth, layered products for thermal lithography using the material, and method of manufacturing a mold using the material and layered product.

Solution to the Problem

As a result of earnest studies and repeated experiments to solve the problem, the inventors found that heat-reactive resist materials having high resistance to dry etching using fluorocarbons are obtained from materials containing an element selected from elements in which the boiling point of a primary fluoride is 200° C. or more, and arrived at completion of the invention. More specifically, the invention is as described below.

A heat-reactive resist material of the invention is a heat-reactive resist material used in dry etching using fluorocarbons, and preferably contains at least one kind of an element in which the boiling point of the primary fluoride is 200° C. or more.

In the heat-reactive resist material of the invention, it is preferable that both an area in which heat reaction occurs and another area in which heat reaction does not occur are provided inside a spot diameter of a laser.

The heat-reactive resist material of the invention preferably contains any one of an imperfect oxide material, a decomposable oxide material, a decomposable nitride material, a decomposable carbide material, a decomposable carbon oxide material, a decomposable sulfide material, a decomposable selenide material, a fusible composite metal material, a phase-change composite metal material, and an oxidizing composite metal material.

In the heat-reactive resist material of the invention, it is preferable that a pattern is capable of being formed by at least one of oxidation, decomposition, melting and phase change.

It is preferable that the heat-reactive resist material of the invention contains an imperfect oxide, and that the imperfect oxide is an imperfect oxide of an element selected from the group consisting of transition metals and group XII to group XV elements.

In the heat-reactive resist material of the invention, the imperfect oxide is preferably an imperfect oxide of an element selected from the group consisting of Ti, Cr, Mn, Fe, Co, Ni, Cu, Zr, Nb, Rh, Ag, Hf, Ta, Au, Al, Zn, Ga, In, Sn, Sb, Pb and Bi.

In the heat-reactive resist material of the invention, the imperfect oxide is preferably an imperfect oxide of an element selected from the group consisting of Ti, Cr, Mn, Co, Cu, Nb, Ag, Ta, Au, Sn, Pb and Bi.

It is preferable that the heat-reactive resist material of the invention contains any one of a decomposable oxide, a decomposable nitride, a decomposable carbide, a decomposable carbon oxide, a decomposable sulfide, and a decomposable selenide, the decomposable oxide is an oxide of an element selected from groups II, V, VI, VII, VIII, IX, XI, XII and XIV except Ag, Au and Pd, the decomposable nitride is a nitride of an element selected from groups II, VI, VIII, XI and XII except Ag and Au, and that the decomposable carbide, the decomposable carbon oxide, the decomposable sulfide, and the decomposable selenide are compounds selected from a carbide, a carbon oxide, a sulfide and a selenide of an element selected from groups II to IX and groups XI to XV.

In the heat-reactive resist material of the invention, it is preferable that the decomposable oxide is any one of CuO, $Co_3O_4$, $MnO_2$, $Mn_2O_3$, $CrO_3$, $Cr_5O_{12}$, $PbO_2$, $Pb_3O_4$, $TaO_2$, $Rh_2O_3$, $RuO_2$, $MgO_2$, $CaO_2$, $BaO_2$, and $ZnO_2$, the decomposable carbide is any one of $NdC_2$ and $Al_4C_3$, the decomposable carbon oxide is any one of $MgCO_3$, $CaCO_3$, $SrCO_3$, $BaCO_3$, $ZnCO_3$, $CdCO_3$, $Ag_2CO_3$, $PbCO_3$, and $NiCO_3$, the decomposable nitride is any one of $Zn_3N_2$, CrN, $Cu_3N$, $Fe_2N$, and $Mg_3N_2$, the decomposable sulfide is any one of CuS, $Ni_3S_4$, FeS, $FeS_2$, $Fe_2S_3$, $SnS_2$, $HfS_2$, $TiS_2$, $Rh_2S_3$, $RuS_2$, $Bi_2S_3$, $Cr_2S_3$, GaS, $BaS_3$, $MnS_2$ and $Nd_2S_3$, and that the decomposable selenide is any one of CuSe, $Bi_2Se_3$, FeSe, and GaSe.

In the heat-reactive resist material of the invention, it is preferable that the decomposable oxide is any one of CuO, $Co_3O_4$, $MnO_2$, $Mn_2O_3$, $CrO_3$, $Cr_5O_{12}$, $PbO_2$, $Pb_3O_4$, $MgO_2$, $CaO_2$, $BaO_2$, and $ZnO_2$, the decomposable carbon oxide is any one of $MgCO_3$, $CaCO_3$, $SrCO_3$ and $BaCO_3$, the decomposable sulfide is anyone of CuS, $FeS_2$, $SnS_2$, and $HfS_2$, and that the decomposable selenide is CuSe.

In the heat-reactive resist material of the invention, it is preferable that the decomposable oxide is any one of CuO, $Co_3O_4$, $MnO_2$, $Mn_2O_3$, $CrO_3$, $Pb_3O_4$, $BaO_2$, and $CaCO_3$, the decomposable sulfide is any one of $FeS_2$ and $SnS_2$, and that the decomposable selenide is CuSe.

In the heat-reactive resist material of the invention, it is preferable that the fusible composite metal material, the phase-change composite metal material, and the oxidizing composite metal material contain two kinds of metals selected from the metal group ($\alpha$) consisting of Mg, Ca, Sr, Ba, Sc, Y, Ti, Zr, Hf, Nb, Ta, Cr, Mn, Fe, Co, Ni, Cu, Ag, Zn, Al, Ga, In, Sn, Pb, Sb and Bi and the metal group ($\beta$) consisting of V, Mo, W, Ge, Se and Te, and that at least one kind in the metals is selected from the metal group ($\alpha$).

In the heat-reactive resist material of the invention, it is preferable that the fusible composite metal material, the phase-change composite metal material, and the oxidizing composite metal material contain two kinds of metals selected from the metal group ($\gamma$) consisting of Mg, Ti, Zr, Nb, Ta, Cr, Mn, Fe, Co, Ni, Cu, Ag, Zn, Al, Ga, In, Pb, Sb and Bi and the metal group ($\delta$) consisting of V, Mo, W, Ge, and Te, and that at least one kind in the metals is selected from the metal group ($\gamma$).

The heat-reactive resist material of the invention is preferably characterized by containing any one of combinations of metals represented by In—Sb, Sn—Sb, Cr—Sb, Ga—Sb, In—Sn, Ni—Sn, Al—Sn, Bi—Sn, Sn—Pb, Ni—Bi, Zn—Sb, Ni—Cr, Ni—Nb, Al—Ni, Cu—Zr, Ag—Zn, Ge—Sb, Sb—Te, Bi—Te, Ni—W, Zn—Te, Pb—Te, Mo—Nb, W—Nb, Cr—Mo and Cu—V.

The heat-reactive resist material of the invention preferably contains any one of $In_5Sb_{95}$, $In_{32}Sb_{68}$, $In_{68}Sb_{32}$, $In_1Sb_{99}$, $Sn_{50}Sb_{50}$, $Cr_{50}Sb_{50}$, $Ga_{50}Sb_{50}$, $Ga_{40}Sb_{60}$, $Ga_{30}Sb_{70}$, $Ga_{20}Sb_{80}$, $Ga_{12}SB_{88}$, $Ga_{10}Sb_{90}$, $In_{47}Sn_{53}$, $In_{53}Sn_{47}$, $Ni_{80.7}Sn_{19.3}$, $Al_{2.2}Sn_{97.8}$, $Bi_{43}Sn_{57}$, $Sn_{26}Pb_{74}$, $Sn_{25}Pb_{75}$, $Sn_{74}Pb_{26}$, $Ni_{50}Bi_{50}$, $Ni_{40}Bi_{60}$, $Ni_{60}Bi_{40}$, $Ni_{70}Bi_{30}$, $Ni_{80}Bi_{20}$, $Ni_{90}Bi_{10}$, $Zn_{32}Sb_{68}$, $Ni_{50}Cr_{50}$, $Ni_{83.8}Nb_{16.2}$, $Ni_{59.8}Nb_{40.2}$, $Al_{97.3}Ni_{2.7}$, $Cu_{90.6}Zr_{9.4}$, $Ag_{70}Zn_{30}$, $Ge_{10}Sb_{90}$, $Ge_{20}Sb_{80}$, $Ge_{30}Sb_{70}$, $Ge_{50}Sb_{50}$, $Bi_{90}Te_{10}$, $Bi_{97}Te_3$, $Ni_{81}W_{19}$, $Zn_{50}Te_{50}$, $Pb_{50}Te_{50}$, $Mo_{40}Nb_{60}$, $Mo_{50}Nb_{50}$, $W_{40}Nb_{60}$, $W_{50}Nb_{50}$, and $Cr_{85}MO_{15}$.

The heat-reactive resist material of the invention preferably contains any one of $Sb_{40}Te_{60}$, $Bi_{10}Te_{90}$, $Cu_{8.6}V_{91.4}$, $Cu_{13.6}V_{86.4}$, and $Cu_{18.6}V_{81.4}$.

The heat-reactive resist material of the invention preferably contains at least an intermetallic compound or a eutectic state.

The heat-reactive resist material of the invention preferably further contains at least one element selected from the group consisting of Al, Si, Ti, V, Cr, Mn, Fe, Co, Ni, Cu, Mo, Zr, Zn, Ga, Ru, Pd, Ag, Cd, Hf, Ta, W, Pt, Au, C and B.

The heat-reactive resist material of the invention is preferably anyone of $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1), $Pb_{1-x}O_x$ (X=0.21), $Mn_2O_3$, CuO, $Co_3O_4$, $Pb_3O_4$, $BaO_2$, $CaCO_3$, $FeS_2$, $SnS_2$, $Bi_{97}Te_3$, $Sb_{40}Te_{60}$, $Ge_{20}Sb_{80}$, $In_{32}Sb_{68}$, $In_5Sb_{95}$, $Mo_{50}Nb_{50}$, $Ga_{50}Sb_{50}$, $Ni_{50}Bi_{50}$, $Ni_{70}Bi_{30}$, $Zn_{50}Te_{50}$, $Cu_{13.6}V_{86.4}$, and $Zn_{32}Sb_{68}$.

In the heat-reactive resist material of the invention, it is more preferable that the heat-reactive resist material is any one of $Cr_{1-x}O_x$ (X=0.24), $Nb_{1-x}O_x$ (X=0.11) $Ta_{1-x}O_x$ (X=0.17), $Ti_{1-x}O_x$ (X=0.18), $Sn_{1-x}O_x$ (X=0.1), $Pb_{1-x}O_x$ (X=0.21), $Mn_2O_3$, CuO, $Co_3O_4$, $Pb_3O_4$, $BaO_2$, $CaCO_3$, $FeS_2$, $SnS_2$, $In_{32}Sb_{68}$, $In_5Sb_{95}$, $Ga_{50}Sb_{50}$, $Ni_{70}Bi_{50}$, $Ni_{70}Bi_{30}$, and $Zn_{32}Sb_{68}$.

In the heat-reactive resist material of the invention, it is the most preferable that the heat-reactive resist material is any one of $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1), $Pb_{1-x}O_x$ (X=0.21), $Mn_2O_3$, CuO, $Co_3O_4$, $Pb_3O_4$, $BaO_2$, $CaCO_3$, $FeS_2$ and $SnS_2$.

A layered product for thermal lithography of the invention is provided with a heat-reactive resist layer containing mainly the above-mentioned heat-reactive resist material, and an etching layer provided on the heat-reactive resist layer, and it is preferable that an etching material constituting the etching layer contains at least one or more kinds of elements such that the boiling point of a primary fluoride is 250° C. or less, and that the boiling point of the primary fluoride of a main element constituting the heat-reactive resist material is higher than the boiling point of the primary fluoride of a main element constituting the etching material.

In the layered product for thermal lithography of the invention, the etching material is preferably a material selected from the group consisting of Ta, Mo, W, C, Si, Ge, Te and P, complexes of two or more kinds thereof, their oxides, their nitrides, their sulfides, and their carbon oxides.

In the layered product for thermal lithography of the invention, the etching material is preferably a material selected from the group consisting of Ta, Si, Ge and P, their oxides, their nitrides, their sulfides, their carbon oxides, and silicide of Mo and W.

In the layered product for thermal lithography of the invention, the etching material is preferably a material selected from the group consisting of Ta, Si, Ge and P, their oxides, and their nitrides.

In the layered product for thermal lithography of the invention, the etching material is most preferably a material selected from the group consisting of $SiO_2$, Si and $Si_3N_4$.

A method of manufacturing a mold of the invention preferably includes a step (1) of providing an etching layer comprised of the etching material used in the above-mentioned layered product for thermal lithography on a substrate, and further depositing a resist layer comprised of the above-mentioned heat-reactive resist material on the etching layer to form a layered film, a step (2) of exposing the heat-reactive resist layer of the layered film, and then developing, a step (3) of subsequently performing dry etching on the etching layer with fluorocarbons using the heat-reactive resist layer as a mask, and a step (4) of removing the heat-reactive resist for manufacturing as a mold.

In the method of manufacturing a mold of the invention, deposition in the step (1) is preferably performed by a sputtering method, vapor deposition method, or CVD method.

In the method of manufacturing a mold of the invention, the substrate is preferably in the shape of a flat plate.

In the method of manufacturing a mold of the invention, the substrate is preferably in the shape of a sleeve.

In the method of manufacturing a mold of the invention, exposure in the step (2) is preferably performed using a semiconductor laser.

A mold of the invention is characterized by being manufactured by the above-mentioned method of manufacturing a mold.

In the mold of the invention, the mold preferably has a fine pattern ranging from 1 nm to 1 μm.

Technical Advantage of the Invention

According to the invention, it is possible to provide heat-reactive resist materials having high resistance to dry etching using fluorocarbons to form a pattern with a deep groove depth, layered products for thermal lithography using the material, and method of manufacturing a mold using the material and layered product.

DESCRIPTION OF EMBODIMENTS

A heat-reactive resist material according to the invention has high resistance to dry etching processing using fluorocarbons. As described above, when it is desired to form a pattern with a desired deep groove depth as well as a fine pattern shape, it is difficult to obtain such a depth only by using a heat-reactive resist material alone, and required is a layered structure with an etching layer formed under the layer of the heat-reactive resist material. In this case, for a period during which the lower side etching layer undergoes the dry etching processing, the heat-reactive resist material functioning as a mask is required to have high dry etching resistance. In other words, in the heat-reactive resist material of the invention, it is important that the heat-reactive resist material has a low etching rate, or is not etched in the dry etching processing by fluorocarbons.

Herein, in considering the mechanism of dry etching by fluorocarbons, fluorine activated inside the vacuum chamber of the dry etching apparatus combines with an element used in the resist, and forms the fluoride. When the vapor pressure of the fluoride is relatively high (i.e. when the boiling point of the fluoride is relatively low), the fluoride vaporizes and disappears from the resist material, and as a result, etching is progressed. Meanwhile, when the vapor pressure of the fluoride is relatively low (i.e. when the boiling point of the fluoride is relatively high), since the fluoride is hard to vaporize, the etching rate is low or etching is not progressed. The degree of the vapor pressure is deeply associated with the boiling point of the fluoride.

Recently, as a result of accumulated experiments, the inventors of the invention have found that among elements to select as a heat-reactive resist material, by selecting an element such that the boiling point of the fluoride of the element is 200° C. or more as a heat-reactive resist material, the resist material exhibits high resistance to the dry etching processing using fluorocarbons, and verified the effect. In addition, in the case that the element forms multi-valent fluorides, the boiling point of the fluoride indicates the boiling point of the fluoride of the primary valency of the metal (=boiling point of the primary fluoride). For example, using chromium as an example, chromium is capable of being zero-valent, divalent, trivalent and hexavalent. Therefore, as the fluoride of chromium, it is possible to form $CrF_2$, $CrF_3$, and $CrF_6$. Since the primary valency of chromium is trivalent, the primary fluoride of chromium designates $CrF_3$, and the boiling point of the primary fluoride designates the boiling point of $CrF_3$.

Figure 1:
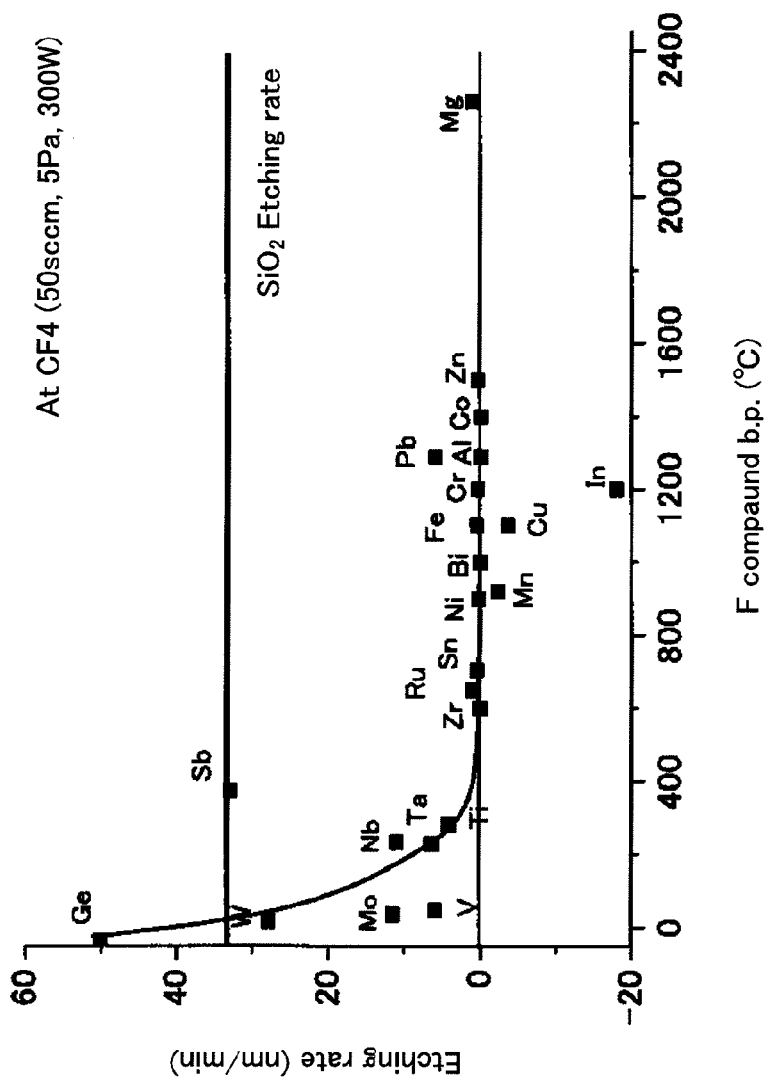
FIG. 1 is a diagram illustrating the relationship between the boiling point of fluoride and dry etching rate.

The boiling point of the fluoride of the element constituting the heat-reactive resist material of the invention is 200° C. or more, preferably 250° C. or more, more preferably 700° C. or more, further more preferably 800° C. or more, and most preferably 950° C. or more. As the boiling point of the fluoride becomes higher, resistance to dry etching using fluorocarbons increases. Table 1 described the boiling points of fluorides of elements constituting the heat-reactive resist material according to the invention (melting points are substituted for boiling points of elements that do not have boiling points.) Further, FIG. 1 shows the relationship between the boiling point of the fluoride of each metal disclosed in the Description and the dry etching rate using a $CF_4$ gas. As suggested in FIG. 1, by using the element such that the boiling point of the fluoride is 200° C. or more to constitute the heat-reactive resist material, the heat-reactive resist material shows high dry etching resistance (when the boiling point of the fluoride falls below 200° C., the dry etching rate increases exponentially.) Herein, FIG. 1 shows the dry etching rate of the metal alone, and with respect to the oxide, nitride, carbide, carbon oxide and selenide, since the metal contained in each compound affects the dry etching rate significantly, so the tendency is the same.

TABLE 1

| Fluoride | Boiling point |
| --- | --- |
| $CaF_2$ | 2500 |
| $SrF_2$ | 2460 |
| $NdF_3$ | 2327 |
| $MgF_2$ | 2260 |
| $BaF_2$ | 2260 |
| $CdF_2$ | 1748 |
| $ZnF_2$ | 1497 |
| $CoF_2$ | 1400 |
| $AlF_3$ | 1291 |
| $PbF_2$ | 1290 |
| $InF_3$ | 1200 |
| $AgF$ | 1150 |
| $CrF_3$ | 1100 |
| $FeF_3$ | 1100 |
| $NiF_2$ | 1000 |
| $GaF_3$ | 1000 |
| $HfF_4$ | 968 |
| $CuF_2$ | 950 |
| $BiF_3$ | 900 |
| $MnF_2$ | 856 |
| $SnF_4$ | 705 |
| $RuF_3$ | 650 |
| $RhF_3$ | 600 |
| $ZrF_4$ | 600 |
| $SbF_3$ | 376 |
| $AuF_3$ | 300 |
| $TiF_4$ | 284 |
| $NbF_5$ | 235 |
| $TaF_5$ | 230 |
| $TeF_4$ | 197 |
| $SeF_4$ | 106 |
| $VF_5$ | 48 |
| $MoF_6$ | 35 |
| $WF_6$ | 17 |
| $GeF_4$ | −36 |

Figure 2:
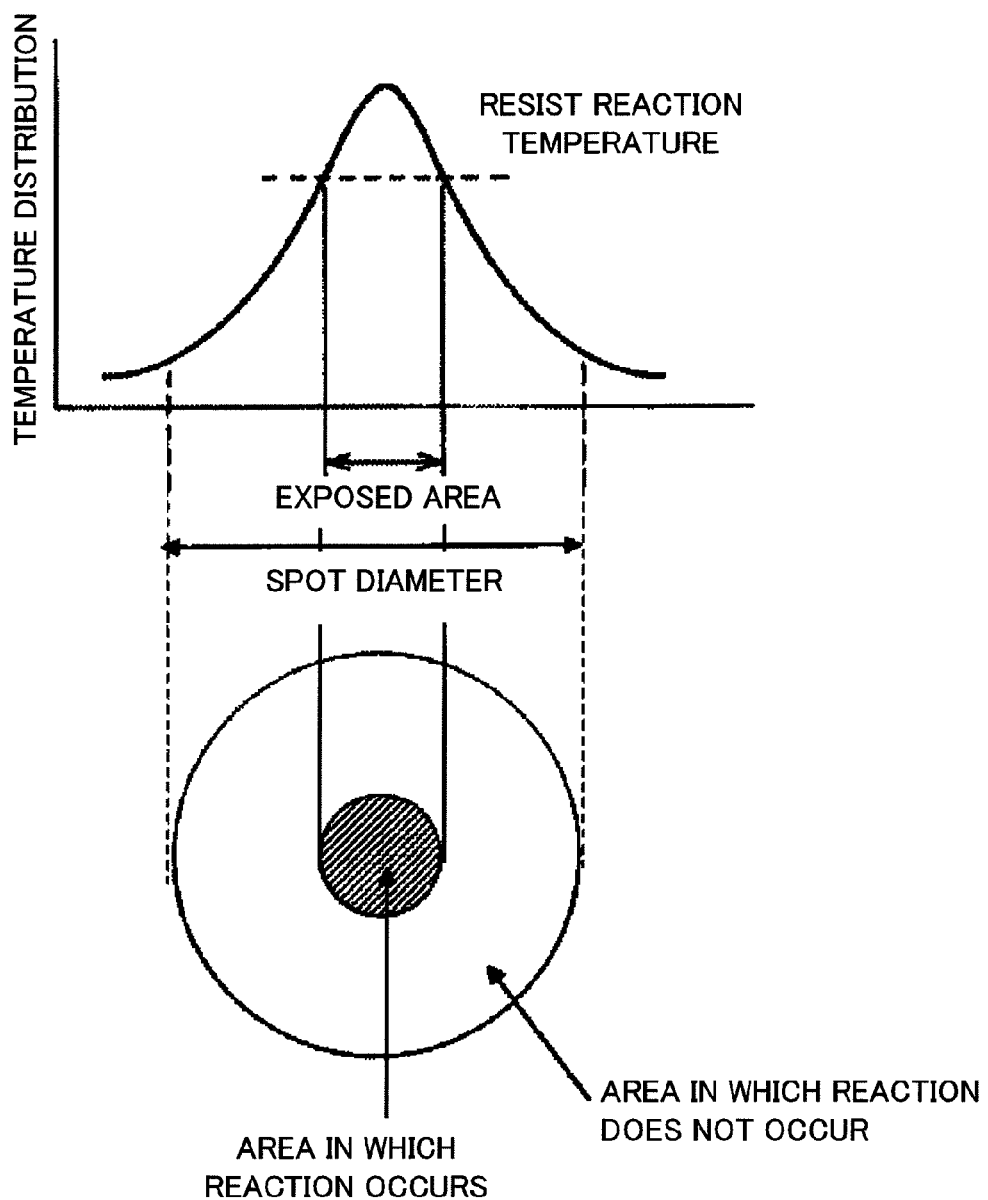
FIG. 2 is a diagram illustrating an area in which a heat-reactive resist material reacts and another area in which the material does not react.

The heat-reactive resist material according to the invention preferably has both an area in which heat reaction occurs and another area in which heat reaction does not occur inside a spot diameter (within the irradiation range) of a laser. In the invention, by focusing on the heat-reactive resist material as a resist material instead of a photoresist material, it is achieved having the area in which the resist material reacts and another area in which the resist material does not react within the irradiation range of laser light. FIG. 2 is a schematic diagram illustrating the relationship between the spot diameter (irradiation area) of laser light and the temperature distribution inside the spot diameter when the heat-reactive resist material is irradiated with the laser light. As shown in FIG. 2, when the laser light is applied substantially perpendicularly to the main surface of the heat-reactive material, the spot diameter of the laser light is formed substantially in the shape of a circle on the main surface of the resist material with the focus of the laser light as the center. Herein, as shown in the upper portion of FIG. 2, the temperature distribution of the laser light inside the spot diameter has the peak near the focus of the laser light, and decreases toward the outer edges of the irradiation range. In this case, by using a heat-reactive resist material reacting at a predetermined temperature, it is possible to expose the portion near the focus of the laser light. In other words, by providing the heat-reactive resist material with the area in which the material reacts at the predetermined temperature or more with respect to the temperature distribution occurring inside the spot diameter of the laser, it is made possible to achieve the processing finer than the spot diameter. By this means, in the invention, it is possible to perform exposure using a semiconductor laser which is small-size and inexpensive and eliminates the need for specific equipment. For example, the wavelength of currently commercial semiconductor lasers with short wavelengths is about 405 nm, and the spot diameter of the laser is about 420 nm (numerical aperture: 0.85). Therefore, the microprocessing of 420 nm or less is not capable of being performed in principle as long as photoresist materials are used, but by using the heat-reactive resist material, it is possible to exceed the limitations, and perform microprocessing less than the wavelength of the semiconductor laser.

In the heat-reactive resist material of the invention, it is preferable that the material contains a material enabling a pattern to be formed by one of oxidation, decomposition, melting and phase change.

Previously, reported are methods of forming a pattern in a heat-reactive resist material using reaction of oxidation, decomposition, melting, phase change, coagulation, sublimation or the like. Among the methods, many coagulation type resist materials tend to cause random growth since it accompanies the nucleation, and are considered difficult to form a uniform pattern. Meanwhile, in the sublimation type resist material, there is little material which shows the characteristics to sublimate originally, in addition extremely high energy is required to cause the reaction to proceed from a solid to a gas in a stroke, and there are extremely large restrictions such that the heating source is largely restricted. In contrast thereto, as materials to oxidize, decompose, melt or cause phase change, there are remarkably many types, and materials to oxidize, decompose, melt or cause phase change exist among the materials comprised of elements such that the boiling point of the fluoride is 200° C. or more selected as the resist material according to the invention, and are capable of being selected as the heat-reactive resist material according to the invention. Further, the materials to oxidize, decompose, melt or cause phase change are high in controllability in uniform pattern as compared with materials to cause coagulation or sublimate, and are preferable as the heat-reactive resist material according to the invention. The materials to oxidize, decompose or melt are more preferable. In the phase change material, there are many materials such that the reaction proceeds at relatively low temperatures, and the materials are often apt to undergo a disturbance factor from the environment. The materials to oxidize or decompose are the most preferable. As compared with the materials to melt, the materials to oxidize or decompose are excellent in the fine pattern shape (edge roughness, etc.)

In the heat-reactive resist material, by causing oxidation, decomposition, melting or phase change, physical and chemical differences occur between a portion where the changes develops and another portion where the change does not develop, a difference thereby results in the etching rate in the developing solution, and it is thus possible to form a desired fine pattern as the resist.

Among the heat-reactive resist materials of the invention are imperfect oxide materials as materials to cause a development difference by oxidation, decomposable oxide materials, decomposable nitride materials, decomposable carbide materials, decomposable carbon oxide materials, decomposable sulfide materials and decomposable selenide materials as materials to cause a development difference by decomposition, fusible composite metal materials as materials to cause a development difference by melting, phase-change composite metal materials as materials to cause a development difference by phase change, and further, oxidizing composite metal materials as materials to cause a development difference by oxidation. In the heat-reactive resist materials according to the invention, it is possible to form a desired fine pattern using these materials.

The imperfect oxide materials will be described specifically among the heat-reactive resist materials of the invention.

The heat-reactive resist material of the invention preferably contains an imperfect oxide. Herein, in the Description, the "imperfect oxide" designates the state in which the oxygen content is insufficient with respect to the oxide of the stoichiometric composition corresponding to the valency that the element is capable of obtaining among elements selected from the group consisting of transition metals and group XII to group XV elements. Since oxygen is insufficient as compared with the stoichiometric composition, the element is capable of further combining with oxygen. By performing heating on the state in which oxygen (oxidation degree) is imperfect, by exposure, etc. the oxidation reaction proceeds in the heated portion, and a difference in the oxidation degree develops between the heated portion and non-heated portion. By using the difference in the oxidation degree, it is possible to form a pattern by development. The oxidation degree of the imperfect oxide is described using Cr as an example. When the oxidation state of chemical formula $CrO_3$ is converted into the ratio in the composition, the state is represented by $Cr_{1-x}O_x$, and the case of $x=0.75$ corresponds to $CrO_3$, and is the state in which Cr is not capable of combining with oxygen any more. Accordingly, the imperfect oxides indicate oxides represented by the range of $0<x<0.75$. In the heat-reactive resist material of the invention, when the oxidation state is near $x=0.75$, even though the oxidation further proceeds by heating, the difference in the oxidation degree is small between the heated portion and the non-heated portion, and it becomes difficult to form a pattern by development. Therefore, the imperfect oxide for use in the heat resist material according to the invention preferably lacks oxygen by 20% when the oxidation degree is compared with the stoichiometric composition. Further, among elements, a single element is capable of forming oxides with different valencies. In this case, the state in which the oxygen content is insufficient as compared with the oxide of the stoichiometric composition corresponding to the valency is included in the imperfect oxide of the invention. In addition, it is possible to analyze the valency of the element and the oxygen amount, for example, by X-ray fluorescence spectrometer, X-ray photoelectron spectrometer or the like.

Elements for use in the heat-reactive resist material comprised of the imperfect oxide according to the invention are one or more elements selected from elements such that the boiling point of the fluoride of the element is 200° C. or more among transition metals and group X11 to group XV elements, more specifically Ti, Cr, Mn, Fe, Co, Ni, Cu, Zr, Nb, Rh, Ag, Hf, Ta and Au among transition metals, and Al, Zn, Ga, In, Sn, Sb, Pb and Bi among groups XII to XV elements. More preferably, among the transition metals are Ti, Cr, Mn, Co, Cu, Nb, Ag, Ta and Au, and among the group XII to XV elements are Sn, Pb and Bi. These elements have the boiling point of 200° C. or more in their fluorides, and have high resistance to dry etching using fluorocarbons.

Meanwhile, the requirements required of the heat-reactive resist material according to the invention include that it is possible to form a desired fine pattern as described above, as well as resistance to dry etching. Among the heat-reactive resist materials according to the invention, more preferable material groups are divided into a material group of Ti, Cr, Mn, Co, Cu, Ag, Au and Pb significantly excellent in dry etching resistance, and a material group of Nb, Ta and Sn excellent in thermal $\gamma$ characteristics (capability of forming a fine pattern) as described later. Corresponding to the purpose, it is possible to use the heat-reactive resist materials separately between the case of placing more importance on dry etching resistance (with importance placed on the aspect ratio (value of dividing the groove depth by the pattern width)) and the case of placing more importance on the fine pattern processing. Further, materials provided with both the dry etching resistance and the thermal $\gamma$ characteristics in good balance are Cr, Nb, Ta, Sn, Pb and Ti, and have a wide range of uses in application. In addition, since any one of the elements has the boiling point of 200° C. or more in the fluoride and is sufficient in dry etching resistance, by selecting a combination with a dry etching material as described later as appropriate, using any element enables the sufficient aspect ratio to be achieved. Meanwhile, the etching rates of these metals have some differences depending on the type of gas to use. Accordingly, it is also important to select an etching gas as appropriate, and for example, by using $CHF_3$, it is possible to improve etching resistance in Nb.

In the invention, by thus using the element such that the boiling point of the fluoride is 200° C. or more as the heat-reactive resist material, the heat-reactive resist material is capable of having etching resistance more than about three times etching resistance of the etching layer (for example, $SiO_2$). By using the heat-reactive resist material having dry etching resistance more than about three times, the heat-reactive resist material functions as a mask to form the deep grooves, the etching layer is capable of undergoing the etching processing, and it is possible to form a pattern shape with deep grooves.

Further, the imperfect oxide for use in the heat-reactive resist material according to the invention lacks oxygen, tends to be uncertain in crystal structure as compared with the state without lacking of oxygen, and is apt to form an amorphous state. The amorphous state is capable of reducing roughness of the edge of the fine pattern and preferable as described later. Further, the imperfect oxide material has a lower reflectance than that of the metal material, is usually high in heat absorption efficiency by exposure and preferable.

Next, among the heat-reactive resist materials according to the invention, decomposable materials will be described specifically on the decomposable oxide materials, decomposable nitride materials, decomposable carbide materials, decomposable carbon oxide materials, decomposable sulfide materials and decomposable selenide materials.

The heat-reactive resist material according to the invention is the element such that the boiling point of the fluoride is 200° C. or more, and preferably contains the above-mentioned decomposable oxide material, decomposable nitride material, decomposable carbide material, decomposable carbon oxide material, decomposable sulfide, and decomposable selenide material. The decomposable oxide material may be an oxide of an element selected from groups II, V, VI, VII, VIII, IX, XI, XII and XIV except Ag, Au and Pd, the decomposable nitride material may be a nitride of an element selected from groups II, VI, VIII, XI and XII except Ag and Au, and the decomposable carbide material, the decomposable carbon oxide material, the decomposable sulfide material, and the decomposable selenide material may be compounds selected from a carbide, a carbon oxide, a sulfide and a selenide of an element selected from groups II to IX and groups XI to XV. These decomposable materials naturally have dry etching resistance to fluorocarbons, and are allowed to form a controlled fine pattern by the decomposable materials decomposing by heating.

The heat-reactive resist material according to the invention is characterized by containing at least one kind of an element such that the boiling point of the fluoride is 200° C. or more, and there exists a plurality of decomposable materials containing at least one or more kinds of elements such that the boiling point of the fluoride is 200° C. or more. Among the materials, the decomposable materials selected in the invention are preferably materials such that decomposition behavior by heating is remarkably abrupt, and that the temperature range of the temperature at which decomposition starts to the temperature at which decomposition finishes is extremely small. In other words, when the temperature difference between the start of decomposition and the finish of decomposition is assumed to be $\Delta T$, it is preferable that $\Delta T$ is extremely small. When the characteristics such that the reaction rate is high from start of the thermal reaction to finish of the thermal reaction and that the temperature change is narrow between before and after the reaction, are assumed to be thermal $\gamma$ characteristics, the heat-reactive resist materials according to the invention are preferably materials remarkably excellent in thermal $\gamma$ characteristics.

In the case of the heat-reactive resist material with thermal $\gamma$ characteristics such that the reaction abruptly occurs at the area reaching a predetermined temperature, as shown in FIG. 2, i.e. the decomposable heat-reactive resist material, the material abruptly decomposes, the abrupt reaction proceeds, a development difference by solubility tends to occur in development, and it is possible to form a fine pattern. The judgment of thermal $\gamma$ characteristics is verified, for example, by performing thermogravimetric analysis measurement (TG measurement) with temperature, or the like.

Among the decomposable materials in the invention, as the oxide, nitride, carbide, sulfide and selenide, for example, in the case of the oxide, the perfect oxide and oxide of the state in which oxygen is lost slightly are included in the scope of the perfect oxide according to the invention, and it is not necessary to highly control the state of the starting material as long as the state permits decomposition by laser exposure.

Herein, as compared with the imperfect oxide as described above, the imperfect oxide increases the oxidation degree in the heated portion by being heated, thereby generates the difference in the oxidation degree, causes the development difference and enables pattern formation. Meanwhile, in the decomposable materials, for example, in the case of the decomposable oxide, the oxide is decomposed in the heated portion by being heated, decreases the oxidation degree, thereby generates the difference in the oxidation degree, causes the development difference and enables pattern formation. Accordingly, the decomposable material is completely different from the imperfect oxide material in the development mechanism in the heat-reactive resist material. In the decomposable material, there is no serious problem with the oxidation degree as long as the material is in the state in which the material decomposes by laser exposure. Herein, the oxidation degree is described. In the state in which oxidation proceeds by heating i.e. in the state of the imperfect oxide, decomposition is difficult, and therefore, the range of oxygen of the decomposable oxide is defined as the state in which the rate of oxygen is higher than the rate of oxygen of the imperfect oxide.

The decomposable heat-reactive resist materials according to the invention are selected from materials with good thermal γ characteristics, more specifically, among the decomposable oxides are $CuO$, $Co_3O_4$, $MnO_2$, $Mn_2O_3$, $CrO_3$, $Cr_5O_{12}$, $PbO_2$, $Pb_3O_4$, $TaO_2$, $Rh_2O_3$, $RuO_2$, $MgO_2$, $CaO_2$, $BaO_2$ and $ZnO_2$, among the decomposable carbides are $NdC_2$ and $Al_4C_3$, among the decomposable carbon oxides are $MgCO_3$, $CaCO_3$, $SrCO_3$, $BaCO_3$, $ZnCO_3$, $CdCO_3$, $Ag_2CO_3$, $PbCO_3$ and $NiCO_3$, among the decomposable nitrides are $Zn_3N_2$, $CrN$, $Cu_3N$, $Fe_2N$ and $Mg_3N_2$, among the decomposable sulfides are $CuS$, $Ni_3S_4$, $FeS$, $FeS_2$, $Fe_2S_3$, $SnS_2$, $HfS_2$, $TiS_2$, $Rh_2S_3$, $RuS_2$, $Bi_2S_3$, $Cr_2S_3$, $GaS$, $BaS_3$, $MnS_2$ and $Nd_2S_3$, among the decomposable selenides are $CuSe$, $Bi_2Se_3$, $FeSe$ and $GaSe$, preferable are $CuO$, $Co_3O_4$, $MnO_2$, $Mn_2O_3$, $CrO_3$, $Cr_5O_{12}$, $PbO_2$, $Pb_3O_4$, $MgO_2$, $CaO_2$, $BaO_2$, $ZnO_2$, $MgCO_3$, $CaCO_3$, $SrCO_3$, $BaCO_3$, $CuS$, $FeS_2$, $SnS_2$, $HfS_2$ and $CuSe$, more preferable are $CuO$, $Co_3O_4$, $MnO_2$, $Mn_2O_3$, $CrO_3$, $Pb_3O_4$, $BaO_2$, $CaCO_3$, $FeS_2$, $SnS_2$ and $CuSe$, and further preferable are $CuO$, $Co_3O_4$, $MnO_2$, $Mn_2O_3$, $CrO_3$, $Pb_3O_4$ and $BaO_2$. These materials have remarkably excellent thermal γ characteristics. For the oxidation degree, nitridation degree, carbon-oxidation degree, sulfidation degree, and selenidation degree, as described previously, any states in which decomposition occurs by laser exposure are included in the scope of the heat-reactive resist material of the invention.

By using these decomposable materials, it is possible to form a controlled fine pattern with uniform concavo-convex shapes and line shapes.

Decomposition of the decomposable material in the invention means that the decomposable material changes when the material reaches some temperature (decomposition temperature) by being heated, as compared with before the material reaches the temperature, and for example, means the change of releasing part or all of oxygen contained in the decomposable material in the case of the oxide, the change of releasing part or all of sulfur contained in the decomposable material or the change that oxidation proceeds while releasing sulfur in the case of the sulfide, and the like.

As the decomposable heat-reactive resist material of the invention, $CuO$, $Co_3O_4$, $MnO_2$, $Mn_2O_3$, $CrO_3$, $Pb_3O_4$ and $BaO_2$ are the most preferable. These heat-reactive resist materials are a decomposable material group which is extremely excellent in development characteristics (with a large development difference between the exposed portion and non-exposed portion), as well as the above-mentioned characteristics, and remarkably excellent as the heat-reactive resist material.

Further, the decomposable material used in the heat-reactive resist material of the invention eliminates the need for sophisticated control of the oxidation degree as compared with the imperfect oxide, and is easy to manufacture. Further, many decomposable materials change the structure largely before and after decomposition, tend to cause a development difference before and after decomposition, and are easy to handle in manufacturing. Further, among $Mn_2O_3$, $CuO$, $Co_3O_4$, $Pb_3O_4$, $BaO_2$, $CaCO_3$, $FeS_2$ and $SnS_2$, $Mn_2O_3$, $CuO$, $Co_3O_4$ and $Pb_3O_4$ that are oxides are extremely excellent in stability of aging and are preferable to manufacture, as compared with $BaO_2$ that is a peroxide, $CaCO_3$ that is a carbon oxide, and $FeS_2$ and $SnS_2$ that are sulfides.

The fusible, phase-change or oxidizing heat-reactive resist materials for use in the invention have excellent dry etching resistance, and also have excellent characteristics as the resist. In other words, by exposing by a laser, the materials are melted, changed in phase, or oxidized, and it is possible to form a fine pattern. The heat-reactive resist materials absorb energy applied by laser exposure as thermal energy, physically change or chemically change, and thereby enable a fine pattern to be formed.

Last, among the resist materials of the invention, the fusible composite metal material, phase-change composition metal material and oxidizing composite metal material will be described specifically.

Metals used in the fusible composite metal material, phase-change composition metal material and oxidizing composite metal material according to the invention are broadly divided into a group (α) of metals such that the boiling point of the fluoride is 200° C. or more, i.e. metals high in resistance to the dry etching processing using fluorocarbons, and a group (β) of metals such that the boiling point of the fluoride is less than 200° C., i.e. metals poor in resistance to the dry etching processing using fluorocarbons, and it is preferable to select at least one or more metals such that the boiling point of the fluoride is 200° C. or more. Containing the metal such that the boiling point of the fluoride is 200° C. or more permits having dry etching resistance using fluorocarbons. Therefore, by using these metal materials, the material functions as a mask to form the deep grooves, the etching layer is capable of undergoing the etching processing, and it is possible to form a pattern shape with deep grooves. More specifically, it is preferable that the metal group (α) consists of Mg, Ca, Sr, Ba, Sc, Y, Ti, Zr, Hf, Nb, Ta, Cr, Mn, Fe, Co, Ni, Cu, Zn, Al, Ga, In, Sn, Pb, Sb and Bi and that the metal group (β) consists of V, Mo, W, Ge, Se and Te, and it is more preferable that the metal group (α) consists of Mg, Ti, Zr, Nb, Ta, Cr, Mn, Fe, Co, Ni, Cu, Zn, Al, Ga, In, Pb, Sb and Bi and that the metal group (β) consists of V, Mo, W, Ge, and Te.

It is preferable that the heat-reactive resist material according to the invention contains two kinds of metals selected from the aforementioned metal group (α) and the aforementioned metal group (β), and that at least one or more kinds of metals are selected from the metal group (α). Further, when the metals are selected from only the group (α), preferable are In—Sb, Sn—Sb, Cr—Sb, Ga—Sb, In—Sn, Ni—Sn, Al—Sn, Bi—Sn, Sn—Pb, Ni—Bi, Zn—Sb, Ni—Cr, Ni—Nb, Al—Ni, Cu—Zr and Ag—Zn, and when a single metal is selected from each of the group (α) and group (β), preferable are Ge—Sb, Sb—Te, Bi—Te, Ni—W, Zn—Te, Pb—Te, Mo—Nb, W—Nb, Cr—Mo and Cu—V. By selecting the combination of metals as described previously, the material induces melting, phase change or oxidation that is a physical change or chemical change effectively when laser exposure is performed, and is capable of exhibiting excellent resist characteristics.

The fusible, phase-change and oxidizing heat-reactive resist materials for use in the invention are broadly divided into Bi—Te, Sb—Te, In—Sn, Ni—Sn, Al—Sn, Mo—Nb, Ag—Zn, Bi—Sn, Ni—Cr, Ni—Nb, Al—Ni, Cu—Zr, Ni—W, Pb—Te, W—Nb and Cr—Mo that are fusible materials, Ni—Bi, Cu—V, Bi—Te, Sn—Pb, Sn—Sb, Cr—Sb, In—Sn, Ni—Sn, Al—Sn, Mo—Nb, Ag—Zn, Bi—Sn, Ni—Cr, Ni—Nb, Al—Ni, Cu—Zr, Ni—W, Pb—Te, W—Nb, Cr—Mo and Ga—Sb that are oxidizing materials, and Ge—Sb, In—Sb, Ga—Sb, Zn—Te, Zn—Sb, Cr—Sb, In—Sn and Mo—Nb that are phase-change materials.

Herein, also in the case of using two metals selected from each of the group ($\alpha$) and group ($\beta$), the resist material contains the metal selected from the group ($\alpha$), thereby has dry etching resistance, and is capable of having both excellent resist characteristics and excellent dry etching characteristics. Herein, when importance is placed on higher dry etching resistance i.e. importance is placed on the aspect ratio, it is preferable using metals selected only from the dry etching resistant group ($\alpha$) as the resist material. By using the resist material comprised of only the metals such that the boiling point of the fluoride is 200° C. or more, the material is capable of having higher dry etching resistance.

Further, the composition of the heat-reactive resist material according to the invention preferably provides at least an intermetallic compound or a eutectic state. The composition of the intermetallic compound or eutectic state in the invention means the composition in which the intermetallic compound or eutectic state is substantially formed, and the composition may deviate in the range of not degrading resist characteristics within the range of the composition providing the intermetallic compound or eutectic. The composition providing the intermetallic compound or eutectic state is described in the metal data book, Metallurgy and Metallurgical Engineering Series, etc. In addition, as the composite metal, three or more kinds of metals are considered, but since the composition deviation tends to occur in the manufacturing process, two kinds of metals easy to control the composition are preferable.

More specifically, the heat-reactive resist material according to the invention is preferably any one of combinations of metals indicated by (I) $In_5Sb_{95}$, $In_{32}Sb_{68}$, $In_{68}Sb_{32}$, $In_1Sb_{99}$, $Sn_{50}Sb_{50}$, $Cr_{50}Sb_{50}$, $Ga_{50}Sb_{50}$, $Ga_{40}Sb_{60}$, $Ga_{30}Sb_{70}$, $Ga_{20}Sb_{80}$, $Ga_{12}Sb_{88}$, $Ga_{10}Sb_{90}$, $In_{47}Sn_{53}$, $In_{53}Sn_{47}$, $Ni_{80.7}Sn_{19.3}$, $Al_{2.2}Sn_{97.8}$, $Bi_{43}Sn_{57}$, $Sn_{26}Pb_{74}$, $Sn_{25}Pb_{75}$, $Sn_{74}Pb_{26}$, $Ni_{50}Bi_{50}$, $Ni_{40}Bi_{60}$, $Ni_{60}Bi_{40}$, $Ni_{70}Bi_{30}$, $Ni_{80}Bi_{20}$, $Ni_{90}Bi_{10}$, $Zn_{32}Sb_{68}$, $Ni_{50}Cr_{50}$, $Ni_{83.8}Nb_{16.2}$, $Ni_{59.8}Nb_{40.2}$, $Al_{97.3}Ni_{2.7}$, $Cu_{90.6}Zr_{9.4}$, $Ag_{70}Zn_{30}$, $Ge_{10}Sb_{90}$, $Ge_{20}Sb_{80}$, $Ge_{30}Sb_{70}$, $Ge_{50}Sb_{50}$, $Bi_{90}Te_{10}$, $Bi_{97}Te_3$, $Ni_{81}W_{19}$, $Zn_{50}Te_{50}$, $Pb_{50}Te_{50}$, $Mo_{40}Nb_{60}$, $Mo_{50}Nb_{50}$, $W_{40}Nb_{60}$, $W_{50}Nb_{50}$, and $Cr_{85}Mo_{15}$. In these materials (I), the metal selected from the group ($\alpha$) is at least 50 mol % or more, and the materials are excellent in dry etching resistance. The metal content which is selected from the group ($\alpha$) is more preferably 70% or more, 80% or more, and most preferably 100%. As the content of the metal selected from the group ($\alpha$) increases, the dry etching resistance increases.

Further, the heat-reactive resist material of the invention is preferably combinations of metals indicated by (II) $Sb_{40}Te_{60}$, $Bi_{10}Te_{90}$, $Cu_{8.6}V_{91.4}$, $Cu_{13.6}V_{86.4}$, and $Cu_{18.6}V_{81.4}$. In these materials (II), the metal selected from the group ($\alpha$) is less than 50 mol %, and alloyed in the group ($\beta$), and thus, by selecting the alloyed metal with the high possibility of forming the intermetallic compound or eutectic state, resist characteristics are maintained. Further, dry etching resistance decreases as compared with (I) due to decreases in the ratio of the metal the group ($\alpha$), but in the case of containing Te as in $Sb_{40}Te_{60}$, $Bi_{10}Te_{90}$, and $Cu_{8.6}V_{91.4}$ described in (II), as can be seen from the fact that the boiling point of the fluoride of Te is 197° C., the boiling point is very close to the boiling, point of 200° C. of the fluoride sorted to the group ($\alpha$), and in the case of containing Cu as in $Cu_{13.6}V_{86.4}$, and $Cu_{18.6}V_{81.4}$, the boiling point (melting, point) of the fluoride of Cu is 950° C. or more, and is thus very high. Thus, considering as the entire characteristics of resist, the materials which mentioned above, are relatively excellent in dry etching resistance, and can be used as the resist material of the invention without problems.

Furthermore, the composite metal material used in the heat-reactive resist material according to the invention eliminates the need for applying a reactant gas such as $O_2$ in manufacturing the resist layer by sputtering or the like, is easy to control deposition conditions, and is preferable in manufacturing.

In the invention, the heat-reactive resist material preferably contains at least one metal selected from the group consisting of Al, Si, Ti, V, Cr, Mn, Fe, Co, Ni, Cu, Mo, Zr, Zn, Ga, Ru, Pd, Ag, Cd, Hf, Ta, W, Pt, Au, C and B. By containing these metals, the heat-reactive resist material tends to be amorphous, and is capable of enhancing resist characteristics.

So far, the oxidizing, decomposable, fusible and phase-change heat-reactive resist materials for use in the invention were described.

In the oxidizing, decomposable, fusible or phase-change heat-reactive resist materials for use in the invention, each temperature of the oxidation temperature, decomposition temperature, melting temperature or phase-change temperature ranges from 150° C. to 2500° C.

The oxidation temperature, decomposition temperature, melting temperature or phase-change temperature preferably have a temperature difference from room temperature to some extent so that the material is hard to undergo thermal disturbance factors from the environment, and in the resist material according to the invention, are preferably 150° C. or more. For example, in the case that a temperature difference is large (150° C. or more) between the temperature of oxidation, decomposition, melting or phase change and room temperature when exposed, in the adjacent portion of the spot heated to the reaction temperature, since the temperature difference from room temperature is sufficiently large, heat is not transferred, and as a result, the adjacent portion does not interfere with the neighboring exposed portion and enables the change to occur. Meanwhile, when the temperature is 2500° C. or less, at the oxidation temperature, decomposition temperature, melting temperature or phase change temperature, the exposure apparatus does not become large-scale, and the cost and the like are efficient. Accordingly, each of the oxidation temperature, decomposition temperature, melting temperature or phase change temperature is preferably in the range of 150° C. to 2500° C., more preferably in the range of 150° C. to 2000° C., further preferably in the range of 200° C. to 1800° C., particularly preferably in the range of 250° C. to 1500° C., and most preferably in the range of 250° C. to 1200° C.

The resist material according to the invention becomes significantly hard to undergo the thermal effect of the disturbance in exposure by making the reaction temperature of the resist material 250° C. or more, while having advantages in manufacturing such that the apparatus selection range is widened and that power consumption is reduced by making the temperature 1200° C. or less and thereby enabling the exposure apparatus with low output laser power to be used. As examples, the decomposition temperatures of the decomposable materials are described in Table 2. These materials are in the temperature range as described above, and have excellent characteristics as the resist material.

TABLE 2

| Oxide Material | Decomposition Temperature($\phi$) |
|---|---|
| $ZnO_2$ | 150 |
| $Fe_2S_3$ | 200 |
| $Ag_2CO_3$ | 218 |
| $Fe_2N$ | 200 |
| $CuS$ | 220 |
| $CrO_3$ | 250 |
| $CaO_2$ | 275 |
| $PbO_2$ | 290 |
| $Cu_3N$ | 300 |
| $ZnCO_3$ | 300 |
| $PbCO_3$ | 315 |
| $CdCO_3$ | 357 |
| $Ni_3S_4$ | 377 |
| $BaS_3$ | 400 |
| $Cr_5O_{12}$ | 410 |
| $Pb_3O_4$ | 500 |
| $MnO_2$ | 535 |
| $CuSe$ | 550 |
| $FeS_2$ | 600 |
| $SnS_2$ | 600 |
| $MgCO_3$ | 600 |
| $Bi_2S_3$ | 685 |
| $HfS_2$ | 800 |
| $BaO_2$ | 840 |
| $CaCO_3$ | 900 |
| $Co_3O_4$ | 900 |
| $GaS$ | 970 |
| $BaCO_3$ | 982 |
| $RuS_2$ | 1000 |
| $CuO$ | 1050 |
| $Mn_2O_3$ | 1080 |
| $Rh_2O_3$ | 1300 |
| $FeS$ | 1193 |
| $Mg_3N_2$ | 1300 |
| $Cr_2S_3$ | 1350 |
| $SrCO_3$ | 1340 |
| $Al_4C_3$ | 1400 |
| $CrN$ | 1500 |

The film thickness of the oxidizing, decomposable, fusible, or phase-change heat-reactive resist materials for use in the invention is preferably in the range of 1 nm to 200 nm, more preferably in the range of 1 nm to 100 nm, further preferably in the range of 1 nm to 80 nm, most preferably in the range of 1 nm to 60 nm, and further most preferably in the range of 1 nm to 40 nm. When the film thickness of the heat-reactive resist material is thin, it is possible to maintain uniformity in the film thickness direction by exposure, and precision is improved in fine pattern processing.

Further, in the oxidizing, decomposable, fusible, or phase-change heat-reactive resist materials for use in the invention, the light absorbance preferably ranges from 10% (@ 405 nm) to 100% (@ 405 nm). When the light absorbance is 10% (@ 405 nm) or more, energy of exposure tends to be absorbed by the resist material, and to elevate the temperature of the resist rapidly. Thus, concerning the light absorbance, the higher absorbance is preferable. Here, the light absorbance is a value obtained by subtracting the transmittance (%) and reflectance (%) measured by ultraviolet-visible light spectrophotometer or the like from 100%.

In the oxidizing, decomposable, fusible, or phase-change heat-reactive resist materials for use in the invention, for the purpose of further improving resist characteristics, it is possible to adopt a method of adding another element to the selected resist material. More specific effects include (1) inhibition of crystallization in the initial state (amorphous state), (2) inhibition of particle growth of the resist material in the process of thermal reaction (amorphous state), (3) improvement of the decomposition reaction rate, (4) improvement in the development difference in the exposed/non-exposed portion, (5) improvement in resistance to the dry etching gas, and the like. The effect of (1) is exerted in the deposition process, the effects of (2) and (3) are exerted in the heating process, the effect of (4) is exerted in the development process, and the effect of (5) is exerted in the dry etching process so as to mainly improve resist characteristics. To obtain these effects, it is possible to add additives to the heat-reactive resist material of the invention.

More specifically, concerning (1) and (2), many techniques have previously been studied to add an additive in the same concept as in materials other than the decomposable materials according to the invention. For example, by adding an additive, it is published in Japanese Unexamined Patent Publication No. H04-30726 that it is possible to achieve growth inhibition and homogenization of particles of MnZn ferrite, and it is published in Japanese Unexamined Patent Publication No. 2001-199740 that it is possible to achieve growth inhibition of particles of $SiO_2$. By applying these techniques to the resist material of the invention, it is possible to improve resist characteristics. Concerning (3), for example, when the copper oxide is selected as the heat-reactive resist material, the copper oxide decomposes near at 1000° C., and releases oxygen. When Si is selected as an additive, oxygen generated by the decomposition is promptly captured to promote the decomposition reaction of the copper oxide, and it is possible to improve resist characteristics. Further, in the case of selecting an additive material which forms a complex with the resist material and decomposes at an appropriate temperature, since the decomposition proceeds slightly prior to the decomposition of the resist material, the decomposed portion becomes rarefaction, it is thereby possible to suppress diffusion of heat in the lateral direction of the exposed portion, and as a result, it is possible to achieve rapid decomposition rate. Concerning (4), for example, in the case of considering the positive type heat-reactive resist material, by using techniques of selecting a material that is easy to be developed by heating (for example, the oxidation degree changes) as an additive material to improve the development difference, or techniques of selecting a material that sublimates by heating as an additive material to improve the development difference, and the like, it is possible to improve the resist characteristics. Concerning (5), by adding an element of high resistance to dry etching using fluorocarbons, it is possible to enhance resistance to dry etching of the resist material, and to improve resist characteristics.

As an element capable of being added to the heat-reactive resist material in the invention, suitable is a single material selected from Mg, Al, Si, P, S, Ca, Sc, Ti, V, Cr, Mn, Fe, Co, Ni, Cu, Ge, Sr, Y, Nb, Mo, Zr, Zn, Ga, Ru, Rh, Pd, Ag, Cd, In, Sn, Sb, Te, Ba, Hf, Ta, W, Ir, Pt, Au, Pb, Bi, La, Ce, Nd, Sm, Eu, Gd, C and B, and their oxides, nitrides and carbides, and preferably, suitable is a single material selected from Mg, Al, Si, P, S, Ca, Sc, Ti, V, Cr, Mn, Fe, Co, Ni, Cu, Zn, Ga, Ge, Sr, Y, Zr, Nb, Mo, Ru, Rh, Pd, Ag, Cd, In, Sn, Sb, Te, Ba, Hf, Ta, W, Ir, Pt, Au, Pb, Bi, La, Ce, Nd, Sm, Eu, Gd, C and B, and their oxides, nitrides and carbides. More preferable is a single material selected from the group consisting of Mg, Al, Si, P, S, Ca, Sc, Ti, V, Cr, Mn, Fe, Co, Ni, Zn, Ga, Ge, Sr, Y, Zr, Nb, Mo, Ru, Rh, Pd, Ag, Cd, In, Sn, Sb, Te, Ba, Hf, Ta, W, Ir, Pt, Au, Pb, Bi, La, Ce, Nd, Sm, Eu, and Gd, and their oxides. By selecting oxide as an additive, the manufacturability is improved, while it is possible to obtain high resist characteristics. Further, the most preferable is a single material selected from the group consisting of Al, Si, Ti, V, Cr, Mn, Fe, Co, Ni, Zn, Ga, Zr, Nb, Mo, Ru, Pd, Ag, Cd, In, Sn, Sb, Hf, Ta, W, Pb and Bi, and their oxides. Furthermore, the most preferable is a single material selected from the group consisting of Al, Si, Ti, Mn, Fe, Co, Ni, Ga, Mo, In, Ta and Bi, and their oxides. By selecting these materials, resist characteristics are naturally improved, and it is possible to achieve high manufacturability and low cost.

Among the elements allowed to achieve the above-mentioned effects (1) to (5), particularly, the following elements are included as the element easy to achieve the amorphous state.

As the element capable of being added, suitable are transition metals Ti, V, Mo, Cr, Mn, Fe, Co, Ni, Cu, Zr, Pd, Ag, Cd, Hf, Ta, W, Pt and Au, or groups XII to XV elements C, Al, Zn, Ga, Si, C, Sb, Pb and Bi.

Thus, the reason why the amorphous state is preferable in the stages of deposition and exposure is that when crystals are present in the exposed portion or non-exposed portion, the boundary between the portion that melts by development and the portion that does not melt by development tends to be unclear, and that it is difficult to obtain the clear pattern. In addition, the scope of the amorphous state in the invention includes the fine crystalline state to the extent that does not make the boundary between the portion that melts and the portion that does not melt uncertain.

As the means for making the amorphous state in the resist material having the oxidizing reaction, decomposable reaction, fusible reaction or phase-change reaction, it is possible to adopt the method of adding another element to the selected element.

Hereinafter, preferable combinations and compositions of the resist material and additive material in the invention are described specifically.

In the combination that silicon oxide is added to copper oxide, the amount of silicon oxide is in the range of 0.5 at % to 40 at %, more preferably in the range of 1 at % to 30 at %, and further preferably in the range of 2 at % to 20 at %. In the combination that alumina is added to copper oxide, the amount of alumina is in the range of 0.5 at % to 40 at %, more preferably in the range of 1 at % to 30 at %, and further preferably in the range of 2 at % to 20 at %. In the combination that titanium oxide is added to copper oxide, the amount of titanium oxide is in the range of 0.5 at % to 40 at %, more preferably in the range of 1 at % to 30 at %, and further preferably in the range of 2 at % to 20 at %. In the combination that gallium oxide is added to copper oxide, the amount of gallium oxide is in the range of 0.5 at % to 40 at %, more preferably in the range of 1 at % to 30 at %, and further preferably in the range of 2 at % to 20 at %. In the combination that tantalum oxide is added to copper oxide, the amount of tantalum oxide is in the range of 0.5 at % to 40 at %, more preferably in the range of 1 at % to 30 at %, and further preferably in the range of 2 at % to 20 at %. In the combination that iron oxide is added to copper oxide, the amount of iron oxide is in the range of 0.5 at % to 40 at %, more preferably in the range of 1 at % to 30 at %, and further preferably in the range of 2 at % to 20 at %. In the combination that molybdenum oxide is added to copper oxide, the amount of molybdenum oxide is in the range of 0.5 at % to 40 at %, more preferably in the range of 1 at % to 30 at %, and further preferably in the range of 2 at % to 20 at %. In the combination that indium oxide is added to copper oxide, the amount of indium oxide is in the range of 0.5 at % to 40 at %, more preferably in the range of 1 at % to 30 at %, and further preferably in the range of 2 at % to 20 at %. In the combination that cobalt oxide is added to copper oxide, the amount of cobalt oxide is in the range of 0.5 at % to 40 at %, more preferably in the range of 1 at % to 30 at %, and further preferably in the range of 2 at % to 20 at %. In the combination that manganese oxide is added to copper oxide, the amount of manganese oxide is in the range of 0.5 at % to 40 at %, more preferably in the range of 1 at % to 30 at %, and further preferably in the range of 2 at % to 20 at %. In the combination that bismuth oxide is added to copper oxide, the amount of bismuth oxide is in the range of 0.5 at % to 40 at %, more preferably in the range of 1 at % to 30 at %, and further preferably in the range of 2 at % to 20 at %. In the combination that silicon oxide is added to cobalt oxide, the amount of silicon oxide is in the range of 0.5 at % to 40 at %, more preferably in the range of 1 at % to 30 at %, and further preferably in the range of 2 at % to 20 at %. In the combination that silicon oxide is added to manganese oxide, the amount of silicon oxide is in the range of 0.5 at % to 40 at %, more preferably in the range of 1 at % to 30 at %, and further preferably in the range of 2 at % to 20 at %. In the combination that nickel oxide is added to lead oxide, the amount of nickel oxide is in the range of 0.5 at % to 40 at %, more preferably in the range of 1 at % to 30 at %, and further preferably in the range of 2 at % to 20 at %. In the combination that silicon oxide is added to chromium oxide, the amount of silicon oxide is in the range of 0.5 at % to 40 at %, more preferably in the range of 1 at % to 30 at %, and further preferably in the range of 2 at % to 20 at %. In the combination that nickel is added to gallium antimony, the amount of nickel is in the range of 0.5 at % to 30 at %, more preferably in the range of 1 at % to 20 at %, and further preferably in the range of 2 at % to 10 at %.

The heat-reactive resist material according to the invention is preferably selected from $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1), and $Pb_{1-x}O_x$ (X=0.21) as the imperfect oxide material, from $Mn_2O_3$, $CuO$, $Co_3O_4$, $Pb_3O_4$, $BaO_2$, $CaCO_3$, $FeS_2$, and $SnS_2$ as the decomposable material, and from $Bi_{97}Te_3$, $Sb_{40}Te_{60}$, $Ge_{20}Sb_{80}$, $In_{32}Sb_{68}$, $In_5Sb_{95}$, $Mo_{50}Nb_{50}$, $Ga_{50}Sb_{50}$, $Ni_{50}Bi_{50}$, $Ni_{70}Bi_{30}$, $Zn_{50}Te_{50}$, $Cu_{13.6}V_{86.4}$, and $Zn_{32}Sb_{68}$ as the fusible composite metal material, phase-change composite metal material and oxidizing composite metal material. These resist materials are remarkably excellent in γ characteristics and enable formation of the fine pattern. Further, the resist material is preferably selected from $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1) and $Pb_{1-x}O_x$ (X=0.21) as the imperfect oxide material, from $Mn_2O_3$, $CuO$, $Co_3O_4$, $Pb_3O_4$, $BaO_2$, $CaCO_3$, $FeS_{2\ a}$ and $SnS_2$ as the decomposable material, and from $In_{32}Sb_{68}$, $In_5Sb_{95}$, $Ga_{50}Sb_{50}$, $Ni_{50}Bi_{50}$, $Ni_{70}Bi_{30}$, and $Zn_{32}Sb_{68}$ as the phase-change composite metal material and oxidizing composite metal material, and particularly, is preferably selected from $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1) and $Pb_{1-x}O_x$ (X=0.21) as the imperfect oxide material, and from $Mn_2O_3$, $CuO$, $Co_3O_4$, $Pb_3O_4$, $BaO_2$, $CaCO_3$, $FeS_2$, and $SnS_2$ as the decomposable material.

The heat-reactive resist material of the invention is capable of being formed on an etching layer and used.

A layered product for thermal lithography according to the invention is a layered product in which a heat-reactive resist layer comprised of the heat-reactive resist material, and an etching layer are layered, and is characterized in that an etching material constituting the etching layer contains at least one or more kinds of elements such that the boiling point of the primary fluoride is 250° C. or less, and that the boiling point of the primary fluoride of a main element constituting the heat-reactive resist material is higher than the boiling point of the primary fluoride of a main element constituting the etching material.

Generally, in optical materials, films, etc., it is required that the aspect ratio (value of dividing the depth of the groove by the opening width of the groove) of the fine pattern is at least 1 or more, preferably 1.4 or more, more preferably 2 or more, and further preferably 3 or more, and the aspect ratio of 10 or more is sometimes required. By selecting the aspect ratio freely, the diversity of optical design is widened. Also from this viewpoint, it is essential that the heat-reactive resist material according to the invention is high in resistance to dry etching. Further, preferable as the dry etching layer is a material such that the dry etching rate is fast with respect to the resist layer.

As described above, generally, the processing by dry etching is used to etch uniformly in the depth direction. The etching material constituting the etching layer is preferably comprised of one or more oxide, nitride, carbide and silicide materials selected from elements such that the boiling point of the fluoride formed with the selected element is less than 250° C. It is possible to refer to the indicators used in developing the heat-reactive resist materials according to the invention. In addition, when an etching material of 200° C. or more and less than 250° C. is selected, it is necessary to select the etching material such that etching resistance of the heat-reactive resist material is higher than etching resistance of the etching material. Selection of the material of the etching layer needs to be considered in combination with the selection of the heat-reactive resist layer as a set. In other words, an etching rate of the etching material is required to be faster than that of the heat-reactive resist layer, preferably faster by three times or more and more preferably by five times or more. Further, the etching layer is required to have adherence to the resist layer, and substrate, and when necessary, a heat insulation layer and heat absorption layer, described later. Meanwhile, the heat-reactive resist layer is also comprised of the element such that the boiling point of the fluoride is 200° C. or more, and is therefore extremely excellent in dry etching resistance, and depending on the material, the fine pattern width, developing solution (there may be combinations with the etching material that does not have resistance to the developing solution) and the like are different. Thus, it is necessary to select the material by considering all the facts involved.

The etching material according to the invention is a material capable of being selected from the group consisting of Ta, Mo, W, C, Si, Ge, Te and P, complexes of two or more kinds thereof, their oxides, their nitrides their sulfides, and their carbon oxides, preferably a material selected from the group consisting of Ta, Si, Ge, and P, their oxides, their nitrides, their sulfides, their carbon oxides, and silicide of Mo and W, and further preferably a material selected from the group consisting of Ta, Si, Ge, and P, their oxides, and their nitrides.

Particularly preferable are $SiO_2$, Si and $Si_3N_4$ from the viewpoints of easiness in deposition, stability with time, strength, cost, adherence, etc. and $SiO_2$ is the most preferable.

As the guidelines for selecting optimal materials for the etching layer, it is possible to select materials such that the boiling point of the primary fluoride of the selected element is low.

In the foregoing, the importance of the etching layer is described to make the aspect ratio a desirable value, and it is also possible to form an uniform pattern by integrating the substrate and the etching layer.

The layered product for thermal lithography according to the invention is described as mentioned above, and in the layered product for thermal lithography according to the invention, from the viewpoint of the etching rate, it is preferable that the heat-reactive resist material is selected from $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1) and $Pb_{1-x}O_x$ (X=0.21) as the imperfect oxide material, from $Mn_2O_3$, CuO, $Co_3O_4$, $Pb_3O_4$, $BaO_2$, $CaCO_3$, $FeS_2$ and $SnS_2$ as the decomposable material, and from $Bi_{97}Te_3$, $Sb_{40}Te_{60}$, $Ge_{20}Sb_{80}$, $In_{32}Sb_{68}$, $In_5Sb_{95}$, $Mo_{50}Nb_{50}$, $Ga_{50}Sb_{50}$, $Ni_{50}Bi_{50}$, $Ni_{70}Bi_{30}$, $Zn_{50}Te_{50}$, $Cu_{13.6}V_{86.4}$, and $Zn_{32}Sb_{68}$ as the fusible composite metal material, phase-change composite metal material and oxidizing composite metal material, and that the etching material is selected from Ta, Si, Ge, and P, and their oxides and nitrides.

It is already described that it is necessary to select the resist layer and etching layer by considering all the facts, and further, with narrower pitches of the fine pattern required as market requirements as described previously, these resist materials are remarkably excellent in γ characteristics and enable formation of the fine pattern. Further, since these heat-reactive resist materials enable the fine pattern to reach the level of several tens of nanometers, the etching layer is required to have flat-surface smoothness of the level that does not affect the fine pattern shape. The etching materials described herein enable smoothness to be achieved with ease, for example, by techniques of reducing the sputtering pressure in the decomposition conditions, or the like, and the combinations of these heat-reactive resist materials and etching layers significantly feature the fine pattern formation capability.

Further preferably, in the layered product for lithography according to the invention, it is preferable that the heat-reactive resist material is selected from $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1) and $Pb_{1-x}O_x$ (X=0.21) as the imperfect oxide material, from $Mn_2O_3$, CuO, $Co_3O_4$, $Pb_3O_4$, $BaO_2$, $CaCO_3$, $FeS_{2\ a}$ and $SnS_2$ as the decomposable material, and from $In_{32}Sb_{68}$, $In_5Sb_{95}$, $Ga_{50}Sb_{50}$, $Ni_{50}Bi_{50}$, $Ni_{70}Bi_{30}$, and $Zn_{32}Sb_{68}$ as the phase-change composite metal material and oxidizing composite metal material, and that the etching material is selected from Ta, Si, Ge and P, and their oxides and nitrides. Particularly, $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1) and $Pb_{1-x}O_x$ (X=0.21) are preferable as the imperfect oxide material, and $Mn_2O_3$, CuO, $Co_3O_4$, $Pb_3O_4$, $BaO_2$, $CaCO_3$, $FeS_2$ and $SnS_2$ are preferable as the decomposable material. By selecting the resist material from the materials all of which are extremely excellent in dry etching resistance, it is possible to cope with pattern formation with remarkably deepen groove depths.

The fluorocarbons used in dry etching in etching the etching layer of the layered product for thermal lithography according to the invention are not limited particularly, and include fluorocarbons such as $CF_4$, $CHF_3$, $CH_2F_2$, $C_2F_6$, $C_3F_8$, $C_4F_6$, $C_4F_8$, $C_4F_{10}$, $C_5F_{10}$, $SF_6$ and $CCl_2F_2$, and these gases may be used alone or in combination of a plurality of gases. Further, the scope of the fluorocarbons in the invention includes these fluorocarbons further mixed with $O_2$, $H_2$, Ar, $N_2$, CO and the like, mixed gases of HBr, $NF_3$, $SF_6$, $CF_3$, Br, HCl, HI, $BBr_3$, $BCl_3$, $Cl_2$ and $SiCl_4$, and the mixed gases mixed with gases of Ar, $O_2$, $H_2$, $N_2$, CO and the like.

Further, in the invention, by optimizing the conditions of the type of etching gas as described above, composition, and etching temperature, it is possible to control resistance of the resist as a mask, and the etching direction of the etching layer. For example, there are a method of controlling the molar ratio of F and C of fluorocarbons to use, thereby forming a fluorocarbon film (to function as a protective layer of the resist) on the heat-reactive resist layer, and thus improving resistance of the mask of the resist, another method of adding Ar, thereby controlling the degree of dissociation of the fluorocarbons, and increasing/decreasing the etching rates of the etching layer and the heat-reactive resist layer, and the like.

A method of manufacturing a mold using the heat-reactive resist material according to the invention will be described below. The shape of a mold according to the invention is capable of being the shape of a flat plate or the shape of a sleeve (roller, drum). Since many molds for use in the original disk of optical disks, Nanoimprint and the like are small and in the shape of a flat plate, it is possible to transfer by a simplified apparatus. In the case of transferring to a large area, it is necessary to fabricate a large-size mold, but there are problems that uniformity of the pattern on whole surface of the large-size mold, the pressure is applied uniformly to the enter surface of the mold in transferring, the large-size mold is neatly released, and the like. Meanwhile, in the shape of a sleeve, it is a feature that the pattern can be transferred in large area, but it has been significantly difficult to form a pattern of the size of submicron (1 μm or less) using laser processing and mechanical processing method (see Non-patent Document 4 as described previously).

Each step of the method of manufacturing a mold according to the invention will be described below.

In step (1), an etching layer containing the etching material used in the above-mentioned layered product for thermal lithography is provided on a substrate in the shape of a flat plate or a sleeve, and the above-mentioned heat-reactive resist layer according to the invention is further formed on the etching layer to form a layered film.

In step (2), the heat-reactive resist layer is exposed and an exposed portion (or non-exposed portion) is developed.

In step (3), the dry etching processing is performed on the etching layer with fluorocarbons using the developed heat-reactive resist layer as a mask, and a fine pattern is formed.

In step (4), the heat-reactive resist is removed, and a mold is manufactured.

The heat-reactive resist material used in the method of manufacturing a mold according to the invention may be a single layer or a multi-layer structure with some resist layers combined. In addition, selection of resists is capable of being varied as appropriate corresponding to the step, required processing precision and the like within the scope of exhibiting the effects of the invention.

When the layered structure is selected corresponding to the purpose, by providing the etching layer, it is possible to control the processing depth of a pattern freely, and further, it is possible to select the most suitable film thickness for the processing as the thickness of the heat-reactive resist layer. In other words, by controlling the thickness of the etching layer, it is possible to control the processing depth freely. Further, since it is possible to control the processing depth using the etching layer, the heat-reactive resist layer can be set for the film thickness easy to expose and develop.

Figure 3:
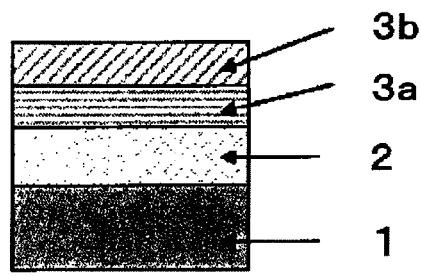
FIG. 3 is a diagram showing an example of a layered product using a heat-reactive resist according to an Embodiment of the invention.

In a substrate according to the invention, the resist layer comprised of the heat-reactive resist material may be a single layer, or as shown in FIG. 3, a multi-layer structure (structure in which an etching layer 2 is formed on a substrate 1, and a first resist layer 3a and second resist layer 3b are successively formed on the etching layer 2) with a plurality of (two, in FIG. 3) resist layers combined. In addition, selection of resists is capable of being varied as appropriate corresponding to the step, required processing precision and the like.

Figure 4:
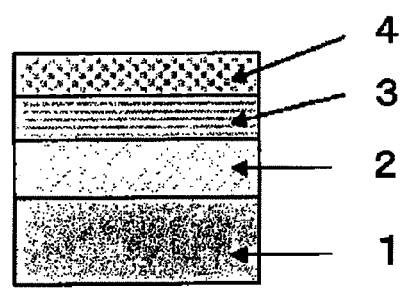
FIG. 4 is a diagram showing another example of the layered product using the heat-reactive resist according to the Embodiment of the invention.
Figure 5:
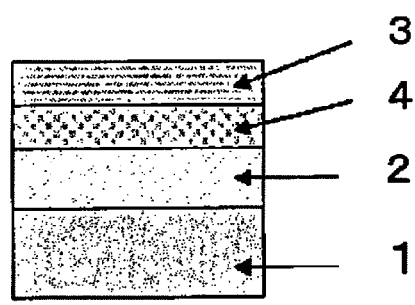
FIG. 5 is a diagram showing still another example of the layered product using the heat-reactive resist according to the Embodiment of the invention.

Further, it is also possible to layer a heat absorption layer on the heat-reactive resist layer, and the role is to widen the selection range of absorption characteristics of light in the heat-reactive resist. For example, as shown in FIG. 4, such a structure may be adopted that the etching layer 2 is formed on the substrate 1, the resist layer 3 is formed on the etching layer 2, and that a heat-absorption layer 4 is formed on the resist layer 3. Alternately, as shown in FIG. 5, such a structure may be adopted that the etching layer 2 is formed on the substrate 1, the heat absorption layer 4 is formed on the etching layer 2, and the resist layer 3 is formed on the heat absorption layer 4.

Generally, many heat-reactive resist materials have absorption at wide wavelengths, but some materials do not have optical absorption at wavelengths of the semiconductor laser, for example, near 405 nm. In this case, the heat absorption layer absorbs energy of the semiconductor laser to convert to heat, and by the heat, the heat-reactive resist material is capable of reacting. Suitable as materials for use in the heat absorption layer in the invention are materials having light absorption at wavelengths of the semiconductor laser, for example, such as C, Mg, Al, Si, Ti, V, Cr, Mn, Fe, Co, Ni, Cu, Zn, Ge, Se, Zr, Nb, Mo, Pd, Ag, In, Sn, Sb, Te, Hf, Ta, W, Pt, Au, Pb, and Bi and their alloys, and oxides, nitrides, sulfides, and carbides comprised of these elements or their mixtures may also be used.

Further, when necessary, the heat-reactive resist layer can be of heat insulation design or heat dissipation design. The heat insulation design will be described below. This design has the effect of preventing dissipation of thermal energy in the portion heated by irradiation of the semiconductor laser. Generally, the substrate is fabricated using a metal or a glass rich in workability. However, since the metal and glass has high thermal conductivity, such a phenomenon occurs that thermal energy in the portion heated by irradiation of the semiconductor laser escapes to the substrate. Accordingly, to heat the exposed portion to the reaction temperature of the heat-reactive resist layer, a semiconductor laser with a higher output is required. The higher output semiconductor laser is not suitable, because of enlargement of size of the optical component and having a short laser life. By providing the heat-insulation layer on the substrate side, dissipation of heat is prevented, and it is possible to use energy of the semiconductor laser more efficiently. Meanwhile, in the case of heat dissipation design, the design is performed when it is necessary to further dissipate heat from the heat-reactive resist material as faster as possible. The heat dissipation design is performed when heat is kept, and reaction thereby proceeds by heat in the area wider than the spot shape of the thermal reaction by exposure.

In the invention, when the heat-reactive resist layer and etching layer undergo film formation, it is preferable to perform film formation using the sputtering method, vapor deposition method and CVD method. The heat-reactive resist material according to the invention enables fine pattern processing with the level of several nanometers, and therefore, it is considered that the film thickness distribution of the heat-reactive resist material in film formation and the concavo-convex structure on the surface affect very significantly depending on the fine pattern size. Then, to reduce these effects as possible, it is preferable forming the heat-reactive resist material using the film formation method of the sputtering method, vapor deposition method, CVD method or the like to forming the material using the film formation method of a coating method, spray method or the like that is difficult in control of uniformity of the film thickness or the like to some extent.

Among the lasers used in exposure apparatus in the invention include excimer lasers such as KrF and ArF lasers, semiconductor lasers, electron beam and X-ray. However, the excimer lasers such as KrF and ArF lasers are very large-size and expensive apparatuses, electron beam and X-ray require using a vacuum chamber, and there are significant limitations from the viewpoints of cost and large size. Accordingly, it is preferable to use semiconductor lasers that enable the light-source apparatus to be extremely small-size and that are inexpensive.

In general, it is made possible to form a fine pattern by reducing the wavelength of light source of exposure apparatus using the electron beam, excimer laser, or the like, and since the heat-reactive resist material of the invention enables a fine pattern to be formed adequately even using the semiconductor laser, the semiconductor laser is preferable as lasers for use in the invention.

For development, it is possible to use an acid and/or alkali solution and/or complex formation agent, organic solvents, etc. It is possible to use common solutions, alone or as a mixed solution, such as hydrochloric acid, sulfuric acid, nitric acid, acetic acid, oxalic acid, hydrofluoric acid, ammonium sulfate, etc. as the acid solution, sodium hydroxide, potassium hydroxide, sodium carbonate, ammonium, TMAH (tetramethyl ammonium hydroxide), etc. as the alkali solution, and oxalic acid, ethylene diamine tetra-acetic acid, and solutions of their salts as the complex formation agent. Further, it is possible to add a potential adjustment agent such as hydrogen peroxide and manganese oxide, or the like to the developing solution. Furthermore, it is possible to add a surfactant or the like to the developing solution to improve development properties. Meanwhile, depending on the resist material, such a method may be adopted that development is first performed using an acid developing solution, and then, performed using an alkali developing solution to achieve objective development.

In the invention, the apparatus used in the step of performing the dry etching processing is not limited particularly, as long as the apparatus is capable of introducing fluorocarbons in a vacuum, forming plasma and performing the etching processing, and it is possible to use commercial dry etching apparatuses, RIE apparatuses, and ICP apparatuses. It is possible to determine the type of processing gas, processing time, applied power, etc. to perform the dry etching processing as appropriate from the type of the resist material, type of the etching layer, thickness of the etching layer, etching rate of the etching layer, etc.

To obtain the mold according to the invention ultimately, it is necessary to remove the heat-reactive resist material. The method of removing the heat-reactive resist material is not limited particularly unless the etching layer is affected, and for example, it is possible to use wet etching, dry etching, etc.

In the invention, by using the methods of manufacturing a mold, it is possible to manufacture a mold having a fine pattern in the range of 1 nm to 1 μm. In addition, in the method of manufacturing a mold according to the invention, it is preferable to use a flat-plate shape as a substrate.

The invention will specifically be described below using the Examples and Comparative Examples performed to clarify the effects of the invention. In addition, the invention is not intended to be limited by the following Examples.

Example 1

Selected as transition metal heat-reactive resist materials were $Cr_{1-x}O_x$, $Nb_{1-x}O_x$, $Ta_{1-x}O_x$ and $Ti_{1-x}O_x$. Further, $SiO_2$ was selected as an etching layer.

First, the film of 350 nm on the conditions as shown in Table 3 described below was formed on a glass flat-plate substrate of 50 mm φ using an $SiO_2$ target by the sputtering method. Subsequently, $Cr_{1-x}O_x$ was deposited in a thickness of 40 nm using a Cr target on the conditions as shown in Table 3. Similarly, with respect to the heat-reactive resist materials $Nb_{1-x}O_x$, $Ta_{1-x}O_x$ and $Ti_{1-x}O_x$, the film of $SiO_2$ with a film thickness of 350 nm was first formed, and then, each of $Nb_{1-x}O_x$, $Ta_{1-x}O_x$ and $Ti_{1-x}O_x$ was deposited on the conditions as shown Table 3.

TABLE 3

| Etching Layer and Resist | Target | Power (W) | Ratio of $O_2$ to Ar | Pressure (Pa) | Film Thickness (nm) | X value |
|---|---|---|---|---|---|---|
| $SiO_2$ | $SiO_2$ (4inφ) | R.F.250 | 0 | 0.5 | 350 | — |
| $SiO_2$—ZnS | $SiO_2$—ZnS (4inφ) | R.F.250 | 0 | 0.5 | 350 | — |
| $Te_{1-x}O_x$ | Te (2inφ) | D.C.15 | 5 | 0.5 | 500 | — |
| $Cr_{1-x}O_x$ | Cr (2inφ) | D.C.80 | 1.6 | 0.5 | 40 | 0.24 |
| $Nb_{1-x}O_x$ | Nb (2inφ) | D.C.80 | 2 | 0.5 | 40 | 0.11 |
| $Ta_{1-x}O_x$ | Ta (2inφ) | D.C.100 | 2 | 0.5 | 40 | 0.17 |
| $Ti_{1-x}O_x$ | Ti (2inφ) | D.C.80 | 4 | 0.5 | 40 | 0.18 |
| $Sn_{1-x}O_x$ | Sn (2inφ) | D.C.15 | 4 | 0.5 | 40 | 0.1 |
| $Pb_{1-x}O_x$ | Pb (2inφ) | D.C.15 | 2 | 0.5 | 40 | 0.21 |
| $W_{1-x}O_x$ | W (2inφ) | D.C.80 | 10 | 0.5 | 75 | 0.4 |

Each of the deposited heat-reactive resist materials was analyzed from the ratio between each metal and the oxide using fluorescent X-rays, and x values as shown in Table 3 were obtained. Further, on the same conditions as described above, only each of the heat-reactive resist materials was deposited, and when XRD (X-Ray Diffraction) analysis was performed, clear diffraction patterns were not obtained in all the materials, showing amorphous.

The resist layer deposited as described above was exposed on the following conditions.

Wavelength of semiconductor laser for exposure: 405 nm

Lens numerical aperture: 0.85

Exposure laser power: 1 mW~10 mW

Feeding pitch: 150 nm~350 nm

It is possible to fabricate various shapes and patterns by modulating the intensity of the laser during exposure, but in the experiments, to verify the exposure accuracy, consecutive groove shapes were used as a pattern. The fabricated shape can also be an isolated circular shape, elliptical shape, etc. according to the intended use, and the invention does not undergo any limitations by the exposure shape.

Subsequently, the heat-reactive resist exposed by the above-mentioned exposure apparatus was developed. Development by the wet process was applied to the development. It is possible to use, as the developing solution, acid or alkali, and further to add a potential adjustment agent, surfactant, etc. to the developing solution to use, and development of each of the heat-reactive resist materials was performed on the conditions as shown in Table 4 described below.

TABLE 4

| | Resist | Principal Resist Change | Developing Solution | Developing Time (Min) | Opening Width/Depth | Etching Depth/Resist Film Thickness | Aspect Ratio |
|---|---|---|---|---|---|---|---|
| Example | | | | | | | |
| 1 | $Cr_{1-x}O_x$ | Oxidation | Diammonium Cerium Nitrate + Nitric Acid | 1 | 250/40 | 350/40 | 1.4 |
| 1 | $Nb_{1-x}O_x$ | Oxidation | Nitric Acid | 20 | 100/40 | 350/30 | 3.5 |
| 1 | $Ta_{1-x}O_x$ | Oxidation | Potassium Hydroxide | 15 | 100/40 | 350/40 | 3.5 |
| 1 | $Ti_{1-x}O_x$ | Oxidation | TMAH | 5 | 200/40 | 350/40 | 1.8 |
| 2 | $Sn_{1-x}O_x$ | Oxidation | TMAH | 2 | 75/40 | 350/38 | 4.7 |
| 2 | $Pb_{1-x}O_x$ | Oxidation | Nitric Acid | 5 | 150/40 | 350/40 | 2.3 |
| 3 | $Cr_{1-x}O_x$ | Oxidation | Diammonium Cerium Nitrate + Nitric Acid | 1 | 250/40 | 500/40 | 2.0 |
| Comparative Example | | | | | | | |
| 1 | $W_{1-x}O_x$ | Oxidation | TMAH | 15 | 150/75 | — | — |

In thus developed heat-reactive resists, the surface shape and cross-sectional shape were observed using SEM (Scanning Electron Microscope), and the opening width (nm) and depth (nm) as shown in Table 4 were formed as a pattern.

Next, etching of $SiO_2$ by dry etching was performed using the obtained heat-reactive resist as a mask. Dry etching was performed using $CF_4$ as an etching gas on the conditions that the processing gas pressure was 5 Pa, the processing power was 400 W, and that the processing time was 15 minutes. After etching, when the surface shape and cross-sectional shape were observed again using SEM (Scanning Electron Microscope), the etching layer depth (nm) and resist film thickness (nm) having the aspect ratio as shown in Table 4 were observed, the pattern was formed while the etching layer reflected the width shape of the mask, and the mask maintained the shape without being etched.

As the mold which was obtained by removing only the heat-reactive resist from the substrate with the patterns, the surface shape was transferred onto a film using a UV curable resin from the mold, and the shape almost inverted from the mold was transferred onto the film.

Example 2

Selected as heat-reactive resist materials of groups XII to XV elements were $Sn_{1-x}O_x$ and $Pb_{1-x}O_x$. As in Example 1, each of these heat-reactive resists was deposited on a $SiO_2$ film with a film thickness of 350 nm on the conditions as shown in Table 3.

Each of the deposited heat-reactive resists was analyzed using fluorescent X-rays, and x values as shown in Table 3 were obtained. Further, on the same conditions as described above, only each of the heat-reactive resist materials was deposited, and when XRD analysis was performed, clear diffraction patterns were not obtained in all the materials, showing amorphous. The resist layer deposited as described above was exposed as in Example 1.

Subsequently, the heat-reactive resist exposed by the above-mentioned exposure apparatus was developed. Development was also performed on the conditions as shown in Table 4 as in Example 1.

In thus developed heat-reactive resists, the surface shape and cross-sectional shape were observed using SEM (Scanning Electron Microscope), and the opening width (nm) and depth (nm) as shown in Table 4 were formed as a pattern.

Next, etching of $SiO_2$ by dry etching was performed using the obtained heat-reactive resist as a mask. Dry etching was performed on the same conditions as in Example 1. After etching, when the surface shape and cross-sectional shape were observed again using SEM (Scanning Electron Microscope), the etching layer depth (nm) and resist film thickness (nm) forming the aspect ratio as shown in Table 4 were observed, the pattern was formed while the etching layer reflected the width shape of the mask, and the mask maintained the shape without being etched.

Using the mold obtained by removing only the heat-reactive resist from the substrate provided with each of the patterns, the surface shape was transferred to a film using a UV curable resin, and the shape almost inverted from the mold was transferred onto the film.

Example 3

Film formation was performed as in Example 1 except that $Cr_{1-x}O_x$ was selected as the transition metal heat-reactive resist material, and that $Te_{1-x}O_x$ was selected as an etching layer, and exposure and development was performed. The deposition conditions of $Te_{1-x}O_x$ are shown in Table 3.

Next, etching of $Te_{1-x}O_x$ by dry etching was performed using the heat-reactive resist as a mask. Dry etching was performed using $CF_4$ as an etching gas on the conditions that the processing gas pressure was 5 Pa, the processing power was 400 W, and that the processing time was 20 minutes. After etching, when the surface shape and cross-sectional shape were observed again using SEM (Scanning Electron Microscope), the etching layer depth (nm) and resist film thickness (nm) forming the aspect ratio as shown in Table 4 were observed, the pattern was formed while the etching layer reflected the width shape of the mask, and the mask maintained the shape without being etched.

Using the mold obtained by removing only the heat-reactive resist from the substrate provided with each of the patterns, the surface shape was transferred to a film using a UV curable resin, and the shape almost inverted from the mold was transferred onto the film.

Example 4

As the heat-reactive resist material of groups XII to XV elements, $Sn_{1-x}O_x$ was selected. Further, $SiO_2$ was selected as an etching layer.

Film formation was performed on a sleeve-shaped substrate (Al hollow cylinder with inside diameter φ 58 mm and outside diameter φ 60 mm) as a substitute for the flat-plate substrate used in Example 1. To deposit the film uniformly, sputtering was performed while rotating the sleeve during deposition. The deposited heat-reactive resist $Sn_{1-x}O_x$ was amorphous with a film thickness of 40 nm and the x value of 0.17.

Thus prepared sleeve was exposed on the following conditions.
Wavelength of semiconductor laser for exposure: 405 nm
Lens aperture: 0.85
Exposure laser power: 1 mW~10 mW
Feeding pitch: 150 nm~350 nm
Rotation speed: 700 rpm Subsequently, the heat-reactive resist exposed by the above-mentioned exposure apparatus was developed. Development was also performed as in Example 1.

Next, etching of $SiO_2$ by dry etching was performed using the obtained heat-reactive resist as a mask. Dry etching was performed on the same conditions as in Example 1. To perform etching uniformly, the sleeve was rotated during etching.

Then, using the mold obtained by removing only the heat-reactive resist from the sleeve, the surface shape was transferred to a film using a UV curable resin.

In thus obtained film, the surface shape and cross-sectional shape were observed using SEM (Scanning Electron Microscope), the same results as values obtained in Example 1 were obtained, and the shape almost inverted from the mold was transferred onto the film.

Comparative Example 1

Selected was W that is an element such that the boiling point of the fluoride is 200° C. or less, and $WO_x$ was used as the heat-reactive resist. Also with respect to the $WO_x$ resist, each film formation was performed on a film of $SiO_2$ with a film thickness of 350 nm on the conditions as shown in Table 3 as in Example 1.

The deposited heat-reactive resist was analyzed using fluorescent X-rays, and the x value as shown in Table 3 was obtained. Further, on the same conditions as described above, only the heat-reactive resist material was deposited, and when XRD analysis was performed, any clear diffraction pattern was not obtained, showing amorphous. The film prepared as described above was exposed as in Example 1.

Subsequently, the heat-reactive resist exposed by the above-mentioned exposure apparatus was developed. Development was also performed on the conditions as shown in Table 4 as in Example 1.

In thus developed heat-reactive resist, the surface shape and cross-sectional shape were observed using SEM (Scanning Electron Microscope), and the opening width (nm) and depth (nm) as shown in Table 4 were formed as a pattern.

Next, etching of $SiO_2$ by dry etching was performed using the obtained heat-reactive resist as a mask. Dry etching was performed on the same conditions as in Example 1. After etching, when the surface shape and cross-sectional shape were observed again using SEM (Scanning Electron Microscope), the resist was lost, and any clear concavo-convex pattern was not observed.

Comparative Example 2

As the heat-reactive resist, $Sn_{1-x}O_x$ was selected. Selected as an etching layer was $SiO_2$—ZnS containing Zn such that the boiling point of the fluoride exceeds 1000° C., and each film formation was performed on the conditions as shown in Table 3.

The deposited heat-reactive resist was analyzed using fluorescent X-rays, and the x value as shown in Table 3 was obtained. Further, on the same conditions as described above, only the heat-reactive resist material was deposited, and when XRD analysis was performed, any clear diffraction pattern was not obtained, showing amorphous. The film prepared as described above was exposed as in Example 1.

Subsequently, the heat-reactive resist exposed by the above-mentioned exposure apparatus was developed. Development was also performed on the same conditions as in Example 1.

In thus developed heat-reactive resist, the surface shape and cross-sectional shape were observed using SEM (Scanning Electron Microscope), and a pattern was formed.

Next, etching of $SiO_2$—ZnS by dry etching was performed using the obtained heat-reactive resist as a mask. Dry etching was performed on the same conditions as in Example 1. After etching, when the surface shape and cross-sectional shape were observed again using SEM (Scanning Electron Microscope), etching residuals were observed in the shape of a pillar, and uniform etching was not made. The front end portion of the pillar shape was subjected to EDX analysis, and a signal belonging to Zn was observed. It is considered that the etching layer contains Zn such that the boiling point of the fluoride is extremely high, Zn is not etched and functions as a mask, and that uniform etching is not made.

Example 5

Selected as heat-reactive resist materials were CuO, $Co_3O_4$, $Mn_2O_3$, and $Pb_3O_4$. Further, the $SiO_2$ layer was selected as an etching layer.

First, the film of 350 nm was formed on a glass flat-plate substrate of 50 mm φ using an $SiO_2$ target by the sputtering method on the conditions as shown in Table 5 described below. Subsequently, $Mn_2O_3$ was deposited in a thickness of 40 nm using a $Mn_2O_3$ target on the conditions as shown in Table 5. Similarly, with respect to the heat-reactive resist materials CuO, $Co_3O_4$, and $Pb_3O_4$, the film of $SiO_2$ with a film thickness of 350 nm was first formed, and then, each of CuO, $Co_3O_4$, and $Pb_3O_4$ was deposited on the conditions as shown Table 5.

TABLE 5

| Etching Layer and Resist | Target | Power (W) | Ratio of $O_2$ to Ar | Pressure (Pa) | Film Thickness (nm) |
|---|---|---|---|---|---|
| $SiO_2$ | $SiO_2$ (4inφ) | R.F. 250 | 0% | 0.5 | 350 |
| $Si_3N_4$ | $SiO_2$ (4inφ) | R.F. 250 | 0% | 0.5 | 350 |
| CuO | CuO (3inφ) | R.F. 100 | O2 gas 50% | 0.5 | 20 |

TABLE 5-continued

| Etching Layer and Resist | Target | Power (W) | Ratio of $O_2$ to Ar | Pressure (Pa) | Film Thickness (nm) |
|---|---|---|---|---|---|
| CuO | CuO (3inφ) | R.F. 100 | $O_2$ gas 10% | 0.5 | 20 |
| $Co_3O_4$ | $Co_3O_4$ (3inφ) | R.F. 200 | $O_2$ gas 10% | 0.5 | 40 |
| $Mn_2O_3$ | $Mn_2O_3$ (2inφ) | R.F. 200 | $O_2$ gas 10% | 0.5 | 40 |
| $Pb_3O_4$ | $Pb_3O_4$ (2inφ) | R.F. 200 | $O_2$ gas 10% | 0.5 | 40 |
| $BaO_2$ | $BaO_2$ (2inφ) | R.F. 80 | $O_2$ gas 5% | 0.5 | 40 |
| $CaCO_3$ | $CaCO_3$ (2inφ) | R.F. 80 | 0% | 0.5 | 40 |
| $FeS_2$ | $FeS_2$ (2inφ) | R.F. 80 | 0% | 0.5 | 40 |
| $SnS_2$ | $SnS_2$ (2inφ) | R.F. 80 | 0% | 0.5 | 40 |

Separately, each of the heat-reactive resist materials was deposited on the same conditions as described above, and when XRD (X-ray diffractometry) was performed, clear diffraction patterns were not obtained in all the materials, showing amorphous.

The resist layer deposited as described above was exposed on the following conditions.
Wavelength of semiconductor laser for exposure: 405 nm
Lens aperture: 0.85
Exposure laser power: 1 mW~10 mW
Feeding pitch: 150 nm~350 nm It is possible to fabricate various shapes and patterns by modulating the intensity of the laser during exposure, but in the experiments, to verify the exposure accuracy, consecutive groove shapes were used as a pattern. The shape to form can be an isolated circular shape, elliptical shape, etc. according to the intended use, and the invention does not undergo any limitations by the exposure shape.

Subsequently, the heat-reactive resist exposed by the above-mentioned exposure apparatus was developed. Development by the wet process was applied to the development. It is possible to use, as the developing solution, acid or alkali, and further to add a potential adjustment agent, surfactant, etc. to the developing solution to use, and development of each of the heat-reactive resist materials was performed on the conditions as shown in Table 6 described below.

In thus developed heat-reactive resists, the surface shape and cross-sectional shape were observed using SEM (Scanning Electron Microscope), and the opening width (nm) and depth (nm) as shown in Table 6 were formed as a pattern.

Figure 6:
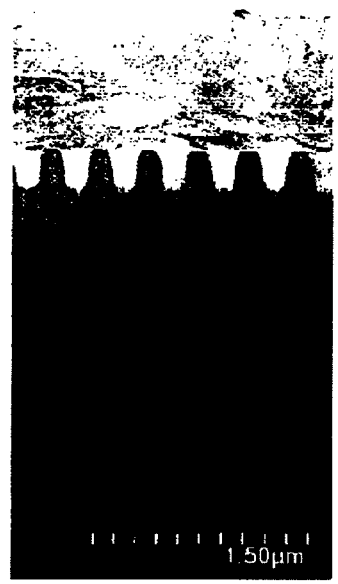
FIG. 6 is a view showing a cross-sectional SEM image after dry etching.

Next, etching of $SiO_2$ by dry etching was performed using the obtained heat-reactive resist as a mask. Dry etching was performed using $CF_4$ as an etching gas on the conditions that the processing gas pressure was 5 Pa, the processing power was 400 W, and that the processing time was 10 minutes. After etching, when the surface shape and cross-sectional shape were observed again using SEM (Scanning Electron Microscope), the uniform fine pattern with the etching layer depth (nm) having the aspect ratio as shown in Table 6 was observed, and the pattern was formed while the etching layer reflected the width shape of the mask. As a typical example, FIG. 6 shows a cross-section SEM image when $Mn_2O_3$ was used as the heat-reactive resin.

Using the mold obtained by removing only the heat-reactive resist from the substrate provided with each of the patterns, the surface shape was transferred to a film using a UV curable resin, and the shape almost inverted from the mold was transferred onto the film.

Example 6

Selected as heat-reactive resist materials were $BaO_2$ and $CaCO_3$. In these heat-reactive resists, a $SiO_2$ film with a film thickness of 350 nm was formed on the same conditions as in Example 5, a heat absorption layer comprised of C was formed on the $SiO_2$ film, and the heat-reactive resist was deposited on the conditions as shown in Table 5. Separately, on the same conditions as described above, only each of the heat-reactive resists was deposited, and when XRD analysis was performed, clear diffraction patterns were not obtained in all the materials, showing amorphous.

The resist layer deposited as described above was exposed as in Example 5. Subsequently, the heat-reactive resist exposed by the above-mentioned exposure apparatus was developed. Development was also performed on the conditions as shown in Table 6 as in Example 5.

In thus developed heat-reactive resists, the surface shape and cross-sectional shape were observed using SEM (Scanning Electron Microscope), and the opening width (nm) and depth (nm) as shown in Table 6 were formed as a pattern.

TABLE 6

| Example | Resist | Principal Resist Change | Developing Solution | Developing Time (Min) | Opening Width/Depth | Etching Depth/Resist Film Thickness | Aspect Ratio |
|---|---|---|---|---|---|---|---|
| 5 | CuO | Decomposition | Nitric Acid | 0.25 | 75/20 | 350/20 | 4.7 |
| 5 | $Co_3O_4$ | Decomposition | Hydrofluoric Acid | 0.5 | 100/40 | 350/40 | 3.5 |
| 5 | $Mn_2O_3$ | Decomposition | Hydrochloric Acid + Hydrogen Peroxide | 1 | 100/40 | 350/40 | 3.5 |
| 5 | $Pb_3O_4$ | Decomposition | TMAH | 0.5 | 100/40 | 350/40 | 3.5 |
| 6 | $BaO_2$ | Decomposition | Sulfuric Acid | 2 | 175/40 | 350/40 | 2.0 |
| 6 | $CaCO_3$ | Decomposition | Hydrochloric Acid + Oxalic Acid | 2 | 175/40 | 350/40 | 2.0 |
| 7 | $FeS_2$ | Decomposition | Nitric Acid | 1 | 175/35 | 350/35 | 2.0 |
| 7 | $SnS_2$ | Decomposition | Hydrochloric Acid | 1 | 175/35 | 350/35 | 2.0 |

Next, etching of the C layer and SiO$_2$ layer by dry etching was performed using the obtained heat-reactive resist as a mask. First, drying etching of C was performed using an O$_2$ gas. Next, dry etching of SiO$_2$ was performed on the same conditions as in Example 5 except that the processing time was changed to 15 minutes. After etching, when the surface shape and cross-sectional shape were observed again using SEM (Scanning Electron Microscope), the uniform fine pattern with the etching layer depth (nm) forming the aspect ratio as shown in Table 6 was observed, and the pattern was formed while the etching layer reflected the width shape of the mask.

Using the mold obtained by removing only the heat-reactive resist from the substrate provided with each of the patterns, the surface shape was transferred to a film using a UV curable resin, and the shape almost inverted from the mold was transferred onto the film.

Example 7

Film formation was performed as in Example 5 except that FeS$_2$ and SnS$_2$ were selected as the heat-reactive resist material, and that Si$_3$N$_4$ was selected as an etching layer, and exposure and development was performed. The deposition conditions of FeS$_2$ and SnS$_2$ are shown in Table 5.

Next, etching of Si$_3$N$_4$ by dry etching was performed using the heat-reactive resist as a mask. Dry etching was performed using CHF$_3$ as an etching gas on the conditions that the processing gas pressure was 5 Pa, the processing power was 400 W, and that the processing time was 15 minutes. After etching, when the surface shape and cross-sectional shape were observed again using SEM (Scanning Electron Microscope), the uniform fine pattern with the etching layer depth (nm) forming the aspect ratio as shown in Table 6 was observed, and the pattern was formed while the etching layer reflected the width shape of the mask.

Using the mold obtained by removing only the heat-reactive resist from the substrate provided with each of the patterns, the surface shape was transferred to a film using a UV curable resin, and the shape almost inverted from the mold was transferred onto the film.

Example 8

As the heat-reactive resist material, CuO was selected. Further, SiO$_2$ was selected as an etching layer. Film formation was performed on a sleeve-shaped substrate (Al hollow cylinder with inside diameter $\phi$ 58 mm and outside diameter $\phi$ 60 mm) as a substitute for the flat-plate substrate used in Example 5 on the same conditions as in Example 1. To deposit the film uniformly, sputtering was performed while rotating the sleeve during deposition. The deposited heat-reactive resist CuO was amorphous.

Thus prepared sleeve was exposed on the following conditions.
Wavelength of semiconductor laser for exposure: 405 nm
Lens aperture: 0.85
Exposure laser power: 1 mW~10 mW
Feeding pitch: 150 nm~350 nm
Rotation speed: 700 rpm Subsequently, the heat-reactive resist exposed by the above-mentioned exposure apparatus was developed. Development was also performed as in Example 5.

Next, etching of SiO$_2$ by dry etching was performed using the obtained heat-reactive resist as a mask. Dry etching was performed on the same conditions as in Example 5. To perform etching uniformly, the sleeve was rotated during etching. Then, using the mold obtained by removing only the heat-reactive resist from the sleeve, the surface shape was transferred to a film using a UV curable resin.

In thus obtained film, the surface shape and cross-sectional shape were observed using SEM (Scanning Electron Microscope), the same results as values obtained in Example 5 were obtained, and the shape almost inverted from the mold was transferred onto the film.

Example 9

As a target to fabricate a heat-reactive resist layer by the sputtering method, CuO and Si (co-sputtering method) were selected. Further, as a target to fabricate an etching layer by the sputtering method, SiO$_2$ was selected.

The etching layer with a thickness of 300 nm was first formed on a glass flat-plate substrate of 50 mm $\phi$ on the conditions as shown in Table 7 as described below. Subsequently, the heat-reactive resist layer was formed using CuO and Si targets on the conditions as shown in Table 7.

TABLE 7

| Example | Target Material | Size | Power (W) | Pressure (Pa) | O$_2$ Amount (%) | Film Thickness (nm) |
|---|---|---|---|---|---|---|
| 9 | SiO$_2$ | 4in$\phi$ | R.F.250 | 0.05 | 0 | 300 |
| 11 | | | | | | |
| 12 | | | | | | |
| 10 | Si$_3$N$_4$ | 4in$\phi$ | R.F.250 | 0.1 | 0 | 300 |
| 9 | CuO | 3in$\phi$ | R.F.100 | 0.5 | 10 | 20 |
|   | Si | 3in$\phi$ | D.C.10 | | | |
| 9 | CuO | 3in$\phi$ | R.F.100 | 0.5 | 10 | 20 |
|   | Al | 3in$\phi$ | D.C.100 | | | |
| 10 | CuO—SiO$_2$ (Cu/Si = 90 at %/10 at %) | 3in$\phi$ | R.F.100 | 0.5 | 10 | 20 |
| 10 | CuO—Si (Cu/Si = 85 at %/15 at %) | 3in$\phi$ | R.F.100 | 0.5 | 15 | 20 |
| 10 | CuO—Al$_2$O$_3$ (Cu/Al = 90 at %/10 at %) | 3in$\phi$ | R.F.100 | 0.5 | 10 | 20 |
| 10 | CuO—TiO$_2$ (Cu/Ti = 90 at %/10 at %) | 3in$\phi$ | R.F.100 | 0.5 | 10 | 20 |
| 10 | CuO—Ga$_2$O$_3$ (Cu/Ga = 90 at %/10 at %) | 3in$\phi$ | R.F.100 | 0.5 | 10 | 20 |
| 10 | CuO—Ta$_2$O$_5$ (Cu/Ta = 90 at %/10 at %) | 3in$\phi$ | R.F.100 | 0.5 | 10 | 20 |
| 10 | CuO—Fe$_2$O$_3$ (Cu/Fe = 90 at %/10 at %) | 3in$\phi$ | R.F.100 | 0.5 | 10 | 20 |
| 11 | CuO—MoO$_3$ (Cu/Mo = 90 at %/10 at %) | 3in$\phi$ | R.F.100 | 0.5 | 50 | 20 |
| 11 | CuO—In$_2$O$_3$ (Cu/In = 90 at %/10 at %) | 3in$\phi$ | R.F.100 | 0.5 | 10 | 20 |
| 11 | CuO—Co$_3$O$_4$ (Cu/Co = 95 at %/5 at %) | 3in$\phi$ | R.F.100 | 0.5 | 10 | 20 |
| 11 | CuO—Mn$_2$O$_3$ (Cu/Mn = 90 at %/10 at %) | 3in$\phi$ | R.F.100 | 0.5 | 10 | 20 |
| 11 | CuO—Bi$_2$O$_3$ (Cu/Bi = 95 at %/5 at %) | 3in$\phi$ | R.F.100 | 0.5 | 50 | 20 |
| 12 | Co$_3$O$_4$—SiO$_2$ (Co/Si = 95 at %/5 at %) | 3in$\phi$ | R.F.200 | 0.5 | 10 | 40 |

TABLE 7-continued

| Example | Target Material | Size | Power (W) | Pressure (Pa) | $O_2$ Amount (%) | Film Thickness (nm) |
|---|---|---|---|---|---|---|
| 12 | $Mn_2O_3$—$SiO_2$ (Mn/Si = 95 at %/5 at %) | 3inφ | R.F.200 | 0.5 | 10 | 20 |
| 12 | $Pb_3O_4$—NiO (Pb/Ni = 95 at %/5 at %) | 3inφ | R.F.200 | 0.5 | 10 | 40 |
| 12 | Cr—$SiO_2$ (Cr/Si = 95 at %/5 at %) | 3inφ | R.F.80 | 0.5 | 90 | 20 |

In addition, in Table 7, the ratio of each additive material (for example, Cu—Al, 90 at %-10 at %) indicates the ratio in atomic weight.

With respect to the other heat-reactive resist layers, similarly, the etching layer with a film thickness of 300 nm was first formed, and then, each of the heat-reactive resist layers was formed on the conditions as shown in Table 7. The compositions of obtained heat-reactive resist materials were Cu/Si=96 at %/4 at %, and Cu/Al=95 at %/5 at %.

The layered product deposited as described above was exposed on the following conditions.

Wavelength of semiconductor laser for exposure: 405 nm
Lens aperture: 0.85
Exposure laser power: 1 mW~10 mW
Feeding pitch: 100 nm~350 nm It is possible to fabricate various shapes and patterns by modulating the intensity of the laser during exposure, but in the experiments, to verify the exposure accuracy, consecutive groove shapes were used as a pattern. The shape to form can be an isolated circular shape, elliptical shape, etc. according to the intended use, and the invention does not undergo any limitations by the exposure shape.

Subsequently, the heat-reactive resist exposed by the above-mentioned exposure apparatus was developed. Development by the wet process was applied to the development. It is possible to use, as the developing solution, acid, alkali and complex formation agent, and further to add a potential adjustment agent, surfactant, etc. to the developing solution to use, and development of each of the heat-reactive resist materials was performed on the conditions as shown in Table 8 described below.

TABLE 8

| Example | Target | Principal Resist Change | Developing Solution | Development Time (Min) | Opening Width/Depth (nm) | Aspect Ratio |
|---|---|---|---|---|---|---|
| 9 | CuO (100 at %) Si (100 at %) | Decomposition | pH2 $HNO_3$ | 0.25 | 100/20 | 3 |
| 9 | CuO (100 at %) Al (100 at %) | Decomposition | 0.3 wt % [$(COONH_4)_2$ + $H_2O_2$ + SO-135 (Surfactant) +  | 2 | 125/20 | 2.4 |
| 10 | CuO—$SiO_2$ (Cu/Si = 90 at %/10 at %) | Decomposition | 0.6 wt % [EDTA2Na + $H_2O_2$ + SO-135 (Surfactant) + | 2 | 100/15 | 3 |
| 10 | CuO—Si (Cu/Si = 85 at %/15 at %) | Decomposition | 0.6 wt % [EDTA2Na + $H_2O_2$ + SO-135 (Surfactant) + | 2 | 80/20 | 3.8 |
| 10 | CuO—$Al_2O_3$ (Cu/Al = 90 at %/10 at %) | Decomposition | pH2 $HNO_3$ | 2 | 125/10 | 2.4 |
| 10 | CuO—$TiO_2$ (Cu/Ti = 90 at %/10 at %) | Decomposition | pH2 $HNO_3$ | 1 | 100/10 | 3 |
| 10 | CuO—$Ga_2O_3$ (Cu/Ga = 90 at %/10 at %) | Decomposition | 0.6 wt % [EDTA2Na + $H_2O_2$ + SO-135 (Surfactant) + | 4 | 100/15 | 3 |
| 10 | CuO—$Ta_2O_5$ (Cu/Ta = 90 at %/10 at %) | Decomposition | pH13 KOH | 16 | 150/10 | 2 |
| 10 | CuO—$Fe_2O_3$ Cu/Fe = 90 at %/10 at %) | Decomposition | pH1 HCl | 1 | 150/15 | 3 |
| 11 | CuO—$MoO_3$ (Cu/Mo = 90 at %/10 at %) | Decomposition | 0.6 wt % [EDTA2Na + $H_2O_2$ + SO-135 (Surfactant) + | 2 | 100/20 | 3 |
| 11 | CuO—$In_2O_3$ (Cu/In = 90 at %/10 at %) | Decomposition | pH2 HNO | 0.3 | 130/10 | 2.3 |
| 11 | CuO—$Co_3O_4$ (Cu/Co = 95 at %/5 at %) | Decomposition | 0.6 wt % [EDTA2Na + $H_2O_2$ + SO-135 (Surfactant) + | 12 | 120/20 | 2.5 |
| 11 | CuO—$Mn_2O_3$ (Cu/Mn = 90 at %/10 at %) | Decomposition | pH2 HCl + $H_2O_2$ | 0.1 | 130/10 | 2.3 |
| 11 | CuO—$Bi_2O_3$ (Cu/Bi = 95 at %/5 at %) | Decomposition | 0.6 wt % [EDTA2Na + $H_2O_2$ + SO-135 (Surfactant) + | 9 | 120/10 | 2.5 |
| 12 | $Co_3O_4$—$SiO_2$ (Co/Si = 95 at %/5 at %) | Decomposition | HF | 0.2 | 100/40 | 3 |
| 12 | $Mn_2O_3$—$SiO_2$ (Mn/Si = 95 at %/5 at %) | Decomposition | pH2 HCl + $H_2O_2$ | 0.8 | 100/20 | 3 |
| 12 | $Pb_3O_4$—NiO (Pb/Ni = 95 at %/5 at %) | Decomposition | pH1 HCl | 1 | 100/40 | 3 |
| 12 | Cr—$SiO_2$ (Cr/Si = 95 at %/5 at %) | Decomposition | Ethanol | 0.5 | 130/20 | 2.3 |

Also in Table 8, as in Table 7, the ratio of each additive material indicates the ratio in atomic weight.

In thus developed heat-reactive resists, the surface shape and cross-sectional shape were observed using SEM (Scanning Electron Microscope), and the opening width (nm) and depth (nm) as shown in Table 7 were formed as a pattern.

Next, etching of $SiO_2$ by dry etching was performed using the obtained heat-reactive resist as a mask. Dry etching was performed using $CF_4$ as an etching gas on the conditions that the processing gas pressure was 5 Pa, the processing power was 400 W, and that the processing time was 10 minutes. After etching, when the surface shape and cross-sectional shape were observed again using SEM (Scanning Electron Microscope), the uniform fine pattern with the etching layer depth (nm) having the aspect ratio as shown in Table 8 was observed, and the pattern was formed while the etching layer reflected the width shape of the mask.

Figure 7:
FIG. 7 is a view showing another cross-sectional SEM image after dry etching.
Figure 8:
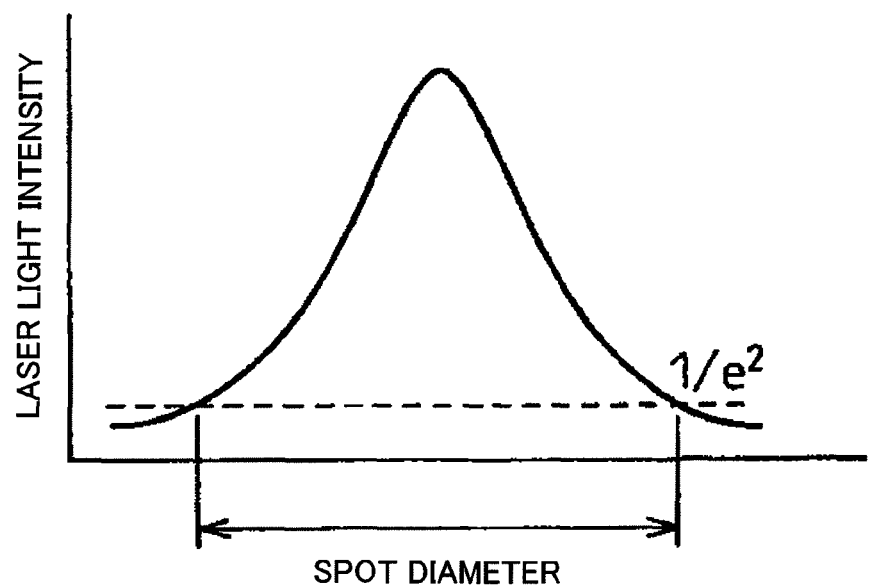
FIG. 8 is a diagram illustrating the intensity distribution of laser light.
Figure 9:
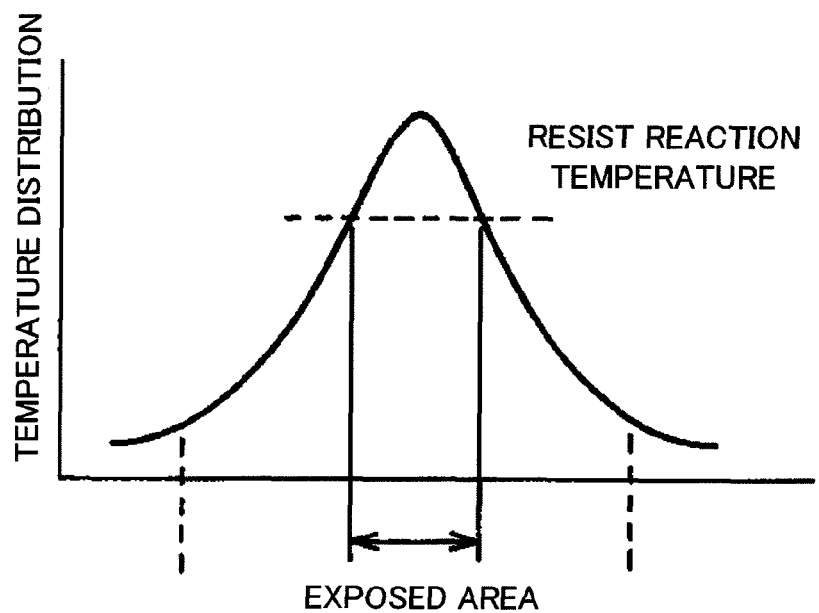
FIG. 9 is a diagram illustrating the temperature distribution of the portion irradiated with the laser light.

Using the mold obtained by removing only the heat-reactive resist from the substrate provided with each of the patterns, the surface shape was transferred to a film using a UV curable resin, and it was confirmed that the shape almost inverted from the mold was transferred onto the film by SEM. As a typical example, FIG. 7 shows a cross-section SEM image of the resist when CuO and Si were used as targets in the heat-reactive resin.

Example 10

As a target to fabricate a heat-reactive resist layer by the sputtering method, CuO—$SiO_2$ (10 at %) was selected. Further, as a target to fabricate an etching layer by the sputtering method, $Si_3N_4$ was selected.

The etching layer with a thickness of 300 nm was first formed on a glass flat-plate substrate of 50 mm φ on the conditions as shown in Table 7. Subsequently, the heat-reactive resist layer was formed using the CuO—$SiO_2$ (Cu/Si=90 at %/10 at %) target on the conditions as shown in Table 7.

With respect to the other heat-reactive resist layers, similarly, the etching layer with a film thickness of 300 nm was first formed, and then, each of the heat-reactive resist layers was formed on the conditions as shown in Table 7. The compositions of obtained heat-reactive resist materials were almost the same as the target compositions. The resist layer deposited as described above was exposed as in Example 9.

Subsequently, the heat-reactive resist exposed by the above-mentioned exposure apparatus was developed. Development was also performed on the conditions as shown in Table 7 as in Example 9.

In thus developed heat-reactive resists, the surface shape and cross-sectional shape were observed using SEM (Scanning Electron Microscope), and the opening width (nm) and depth (nm) as shown in Table 8 were formed as a pattern.

Next, dry etching of the etching layer was performed using the obtained heat-reactive resist as a mask. Dry etching was performed using the etching gas as described in Table 7 on the conditions that the processing gas pressure was 5 Pa, the processing power was 300 W, and that the processing time was 10 minutes. After etching, when the surface shape and cross-sectional shape were observed again using SEM (Scanning Electron Microscope), the uniform fine pattern with the etching layer depth (nm) having the aspect ratio as shown in Table 8 was observed, and the pattern was formed while the etching layer reflected the width shape of the mask.

Using the mold obtained by removing only the heat-reactive resist from the substrate provided with each of the patterns, the surface shape was transferred to a film using a UV curable resin, and it was confirmed that the shape almost inverted from the mold was transferred onto the film by SEM.

Example 11

As a target to fabricate a heat-reactive resist layer by the sputtering method, CuO—$MoO_3$ (Cu/Mo=90 at %/10 at %) was selected. Further, as a target to fabricate an etching layer by the sputtering method, $SiO_2$ was selected.

The etching layer with a thickness of 300 nm was first formed on a glass flat-plate substrate of 50 mm φ on the conditions as shown in Table 7. Subsequently, the heat-reactive resist layer was formed using the CuO—$MoO_3$ (Cu/Mo=90 at %/10 at %) target on the conditions as shown in Table 7.

With respect to the other heat-reactive resist layers, similarly, the etching layer with a film thickness of 300 nm was first formed, and then, each of the heat-reactive resist layers was formed on the conditions as shown in Table 7. The composition of the obtained heat-reactive resist material was almost the same as the target composition. The resist layer deposited as described above was exposed as in Example 9.

Subsequently, the heat-reactive resist exposed by the above-mentioned exposure apparatus was developed. Development was also performed on the conditions as shown in Table 8 as in Example 9.

In thus developed heat-reactive resist, the surface shape and cross-sectional shape were observed using SEM (Scanning Electron Microscope), and the opening width (nm) and depth (nm) as shown in Table 7 were formed as a pattern.

Next, dry etching of the etching layer was performed using the obtained heat-reactive resist as a mask. Dry etching was performed using the etching gas as described in Table 7 on the conditions that the processing gas pressure was 5 Pa, the processing power was 300 W, and that the processing time was 10 minutes. After etching, when the surface shape and cross-sectional shape were observed again using SEM (Scanning Electron Microscope), the uniform fine pattern with the etching layer depth (nm) having the aspect ratio as shown in Table 8 was observed, and the pattern was formed while the etching layer reflected the width shape of the mask.

Using the mold obtained by removing only the heat-reactive resist from the substrate provided with each of the patterns, the surface shape was transferred to a film using a UV curable resin, and it was confirmed that the shape almost inverted from the mold was transferred onto the film by SEM.

Example 12

As a target to fabricate a heat-reactive resist layer by the sputtering method, $Co_3O_4$—$SiO_2$ (Co/Si=95 at %/5 at %) was selected. Further, as a target to fabricate an etching layer by the sputtering method, $SiO_2$ was selected.

The etching layer with a thickness of 300 nm was first formed on a glass flat-plate substrate of 50 mm φ on the conditions as shown in Table 7. Subsequently, the heat-reactive resist layer was formed using the $Co_3O_4$—$SiO_2$ (Co/Si=95 at %/5 at %) target on the conditions as shown in Table 7.

With respect to the other heat-reactive resist layers, similarly, the etching layer with a film thickness of 300 nm was first formed, and then, each of the heat-reactive resist layers was formed on the conditions as shown in Table 7. The composition of the obtained heat-reactive resist material was almost the same as the target composition. The resist layer deposited as described above was exposed as in Example 9.

Subsequently, the heat-reactive resist exposed by the above-mentioned exposure apparatus was developed. Development was also performed on the conditions as shown in Table 7 as in Example 9.

In thus developed heat-reactive resist, the surface shape and cross-sectional shape were observed using SEM (Scanning Electron Microscope), and the opening width (nm) and depth (nm) as shown in Table 8 were formed as a pattern.

Next, dry etching of the etching layer was performed using the obtained heat-reactive resist as a mask. Dry etching was performed using the etching gas as described in Table 8 on the conditions that the processing gas pressure was 5 Pa, the processing power was 300 W, and that the processing time was 10 minutes. After etching, when the surface shape and cross-sectional shape were observed again using SEM (Scanning Electron Microscope), the uniform fine pattern with the etching layer depth (nm) having the aspect ratio as shown in Table 8 was observed, and the pattern was formed while the etching layer reflected the width shape of the mask.

Using the mold obtained by removing only the heat-reactive resist from the substrate provided with each of the patterns, the surface shape was transferred to a film using a UV curable resin, and it was confirmed that the shape almost inverted from the mold was transferred onto the film by SEM.

Example 13

As a target to fabricate a heat-reactive resist layer by the sputtering method, $Bi_{97}Te_3$ and $Sb_{40}Te_{60}$ were selected. Further, as a target to fabricate an etching layer by the sputtering method, $SiO_2$ was selected.

The etching layer with a thickness of 300 nm was first formed on a glass flat-plate substrate of 50 mm φ on the conditions as shown in following Table 9 using the $SiO_2$ target. Subsequently, the heat-reactive resist layer was formed using the $Bi_{97}Te_3$ target on the conditions as shown in Table 9. With respect to the other heat-reactive etching layer, similarly, the etching layer with a film thickness of 300 nm was formed on the conditions as shown in Table 9, and then, the heat-reactive resist layer was formed on the conditions as shown in Table 9 as described below.

The layered product deposited as described above was exposed on the following conditions.
Wavelength of semiconductor laser for exposure: 405 nm
Lens aperture: 0.85
Exposure laser power: 1 mW~10 mW
Feeding pitch: 100 nm~350 nm It is possible to fabricate various shapes and patterns by modulating the intensity of the laser during exposure, but in the experiments, to verify the exposure accuracy, consecutive groove shapes were used as a pattern. The shape to form can be an isolated circular shape, elliptical shape, etc. according to the intended use, and the invention does not undergo any limitations by the exposure shape.

Further, the heat-reactive resist material causes the physical change and/or chemical change, and these changes occur alone or in complex (for example, melting+oxidation, etc.). Table 10 as described below also shows the changes principally occurring in the heat-reactive resist material.

Subsequently, the heat-reactive resist exposed by the above-mentioned exposure apparatus was developed. Development by the wet process was applied to the development. It is possible to use, as the developing solution, acid or alkali, and further to add a potential adjustment agent, surfactant, etc. to the developing solution to use, and development of each of the heat-reactive resist materials was performed on the conditions as shown in Table 9 described below.

In thus developed heat-reactive resists, the surface shape and cross-sectional shape were observed using SEM (Scanning Electron Microscope), and the opening width (nm) and depth (nm) as shown in Table 10 described below were formed as a pattern.

Next, dry etching of the etching layer was performed using the obtained heat-reactive resist as a mask. Dry etching was performed using the etching gas as described in following Table 10 on the conditions that the processing gas pressure was 5 Pa, the processing power was 400 W, and that the processing time was 10 minutes. After etching, when the surface shape and cross-sectional shape were observed again using SEM (Scanning Electron Microscope), the uniform fine pattern with the etching layer depth (nm) having the aspect ratio as shown in following Table 10 was observed, and the pattern was formed while the etching layer reflected the width shape of the mask.

Using the mold obtained by removing only the heat-reactive resist from the substrate provided with each of the patterns, the surface shape was transferred to a film using a UV curable resin, and the shape almost inverted from the mold was transferred onto the film.

In addition, the compositions of the resist layer and the etching layer as described in Tables 9 and 10 are values described with the composition of the target material reflected without change for sake of the convenience, and sometime do not indicate the compositions of the resist layer and the etching layer necessarily without change. The following Examples are also treated in the similar manner.

Example 14

As a target to fabricate a heat-reactive resist layer by the sputtering method, $Ge_{20}Sb_{80}$, $In_{32}Sb_{68}$ and $In_5Sb_{95}$ were selected. Further, as a target to fabricate an etching layer by the sputtering method, $SiO_2$ was selected.

The etching layer with a thickness of 150 nm was first formed on a glass flat-plate substrate of 50 mm φ on the conditions as shown in following Table 9 using the $SiO_2$ target. Subsequently, the heat-reactive resist layer was formed using the $Ge_{20}Sb_{80}$ target on the conditions as shown in following Table 9. With respect to the other heat-reactive resist layers, similarly, the etching layer with a film thickness of 150 nm was formed on the conditions as shown in following Table 9, and then, each of the heat-reactive resist layers was formed on the conditions as shown in following Table 9.

The resist layer deposited as described above was exposed as in Example 13. Subsequently, the heat-reactive resist exposed by the above-mentioned exposure apparatus was developed. Development was also performed on the conditions as shown in following Table 10 as in Example 13.

In thus developed heat-reactive resists, the surface shape and cross-sectional shape were observed using SEM (Scanning Electron Microscope), and the opening width (nm) and depth (nm) as shown in following Table 10 were formed as a pattern.

Next, dry etching of the etching layer was performed using the obtained heat-reactive resist as a mask. Dry etching was performed using the etching gas as described in following Table 10 on the conditions that the processing gas pressure was 5 Pa, the processing power was 400 W, and that the processing time was 10 minutes. After etching, when the surface shape and cross-sectional shape were observed again using SEM (Scanning Electron Microscope), the uniform fine pattern with the etching layer depth (nm) having the aspect ratio as shown in Table 10 was observed, and the pattern was formed while the etching layer reflected the width shape of the mask.

Using the mold obtained by removing only the heat-reactive resist from the substrate provided with each of the patterns, the surface shape was transferred to a film using a UV curable resin, and the shape almost inverted from the mold was transferred onto the film.

Example 15

As a target to fabricate a heat-reactive resist layer by the sputtering method, $Mo_{50}Nb_{50}$, $Ga_{50}Sb_{50}$, $Ni_{50}Bi_{50}$, $Ni_{70}Bi_{30}$, $Zn_{50}Te_{50}$, $Cu_{13.6}V_{86.4}$, $Zn_{32}Sb_{86}$, $Bi_{10}Te_{90}$, $Sn_{74}Pb_{26}$, $Sn_{25}Pb_{75}$, and $Sn_{50}Pb_{50}$ were selected. Further, as a target to fabricate an etching layer by the sputtering method, $Si_3N_4$ was selected.

The etching layer with a thickness of 300 nm was first formed on a glass flat-plate substrate of 50 mm φ on the conditions as shown in following Table 8 using the $Si_3N_4$ target. Subsequently, the heat-reactive resist layer was formed the using the $Mo_{50}Nb_{50}$ target on the conditions as shown in following Table 9. With respect to the other heat-reactive resist layers, similarly, the etching layer with a film thickness of 300 nm was formed on the conditions as shown in Table 9, and then, each of the heat-reactive resist layers was formed on the conditions as shown in Table 9.

The resist layer deposited as described above was exposed as in Example 13. Subsequently, the heat-reactive resist exposed by the above-mentioned exposure apparatus was developed. Development was also performed on the conditions as shown in following Table 9 as in Example 13.

In thus developed heat-reactive resists, the surface shape and cross-sectional shape were observed using SEM (Scanning Electron Microscope), and the opening width (nm) and depth (nm) as shown in Table 10 were formed as a pattern.

Next, dry etching of the etching layer was performed using the obtained heat-reactive resist as a mask. Dry etching was performed using the etching gas as described in following Table 10 on the conditions that the processing gas pressure was 5 Pa, the processing power was 400 W, and that the processing time was 10 minutes. After etching, when the surface shape and cross-sectional shape were observed again using SEM (Scanning Electron Microscope), the uniform fine pattern with the etching layer depth (nm) having the aspect ratio as shown in Table 10 was observed, and the pattern was formed while the etching layer reflected the width shape of the mask.

Using the mold obtained by removing only the heat-reactive resist from the substrate provided with each of the patterns, the surface shape was transferred to a film using a UV curable resin, and the shape almost inverted from the mold was transferred onto the film.

Example 16

As a target to fabricate a heat-reactive resist layer by the sputtering method, $Ga_{50}Sb_{50}$ was selected. Further, as a target to fabricate an etching layer by the sputtering method, $SiO_2$ was selected.

Herein, a sleeve-shaped substrate (hollow cylinder made of Al with inside diameter φ 58 mm and outside diameter φ 60 mm) was used as a substitute for the flat-plate substrate used in Example 15. To deposit the film uniformly, sputtering was performed while rotating the sleeve during deposition.

Thus prepared sleeve was exposed on the following conditions.
Wavelength of semiconductor laser for exposure: 405 nm
Lens aperture: 0.85
Exposure laser power: 1 mW~10 mW
Feeding pitch: 150 nm~350 nm
Rotation speed: 700 rpm Subsequently, the heat-reactive resist exposed by the above-mentioned exposure apparatus was developed. Development was also performed as in Example 15. Next, dry etching of the etching layer was performed using the obtained heat-reactive resist as a mask. Dry etching was performed on the same conditions as in Example 15. To perform etching uniformly, the sleeve was rotated during etching. Then, using the mold obtained by removing only the heat-reactive resist layer from the sleeve, the surface shape was transferred to a film using a UV curable resin.

In thus obtained film, the surface shape and cross-sectional shape were observed using SEM (Scanning Electron Microscope), the same results as values obtained in Example 15 were obtained, and the shape almost inverted from the mold was transferred onto the film.

TABLE 9

| Example | Etching Layer And Resist Layer | Target | Power (W) | Pressure (Pa) | Film Thickness (nm) |
|---|---|---|---|---|---|
| 13 | $SiO_2$ | $SiO_2$(4inφ) | R.F. 250 | 0.05 | 300 |
| 14 | $SiO_2$ | $SiO_2$(4inφ) | R.F. 250 | 0.05 | 150 |
| 15 | $Si_3N_4$ | $Si_3N_4$(4inφ) | R.F. 250 | 0.1 | 300 |
| 13 | $Bi_{97}Te_3$ | $Bi_{97}Te_3$ (2inφ) | D.C. 5 | 0.5 | 40 |
| 13 | $Sb_2Te_3$ | $Sb_2Te_3$ (2inφ) | D.C. 70 | 0.5 | 40 |
| 14 | $Ge_{20}Sb_{80}$ | $Ge_{20}Sb_{80}$(2inφ) | R.F. 40 | 0.3 | 40 |
| 14 | $In_{32}Sb_{68}$ | $In_{32}Sb_{68}$(2inφ) | D.C. 70 | 0.5 | 40 |
| 14 | $In_5Sb_{95}$ | $In_5Sb_{95}$(2inφ) | D.C. 70 | 0.5 | 40 |
| 15 | $Mo_{50}Nb_{50}$ | $Mo_{50}Nb_{50}$(3inφ) | R.F. 100 | 0.5 | 40 |
| 15 | $Ga_{50}Sb_{50}$ | $Ga_{50}Sb_{50}$(3inφ) | R.F. 100 | 0.5 | 40 |
| 15 | $Ni_{50}Bi_{50}$ | $Ni_{50}Bi_{50}$(3inφ) | R.F. 100 | 0.5 | 40 |
| 15 | $Ni_{70}Bi_{30}$ | $Ni_{70}Bi_{30}$(3inφ) | R.F. 100 | 0.5 | 40 |
| 15 | $Zn_{50}Te_{50}$ | $Zn_{50}Te_{50}$(2inφ) | R.F. 100 | 0.5 | 40 |
| 15 | $Cu_{13.6}V_{86.4}$ | $Cu_{13.6}V_{86.4}$(2inφ) | R.F. 80 | 0.5 | 40 |
| 15 | $Zn_{32}Sb_{68}$ | $Zn_{32}Sb_6$(2inφ) | R.F. 80 | 0.5 | 40 |
| 15 | $Bi_{10}Te_{90}$ | $Bi_{10}Te_{90}$(2inφ) | D.C. 70 | 0.5 | 40 |
| 15 | $Sn_{74}Pb_{26}$ | $Sn_{74}Pb_{26}$(2inφ) | D.C. 70 | 0.5 | 40 |
| 15 | $Sn_{26}Pb_{74}$ | $Sn_{26}Pb_{74}$(2inφ) | D.C. 70 | 0.5 | 40 |
| 15 | $Sn_{50}Sb_{50}$ | $Sn_{50}Sb_{50}$(2inφ) | R.F. 40 | 0.5 | 40 |

TABLE 10

| Example | Resist | Principal Resist Change | Developing Solution | Dry Etching Gas | Opening Width/Depth (nm) | Aspect Ratio |
|---|---|---|---|---|---|---|
| 13 | $Bi_{97}Te_3$ | Melting | HCl | $CF_4$ | 200/40 | 1.5 |
| 13 | $Sb_2Te_3$ | Melting | HCl | $CHF_3$ | 100/40 | 3.0 |
| 14 | $Ge_{20}Sb_{80}$ | Phase Change | HCl | $CHF_3$ | 75/40 | 2.0 |
| 14 | $In_{32}Sb_{68}$ | Phase Change | KOH | $CHF_3$ | 120/40 | 1.25 |
| 14 | $In_5Sb_{95}$ | Phase Change | KOH | $CHF_3$ | 120/40 | 1.25 |
| 15 | $Mo_{50}Nb_{50}$ | Oxidation | $HCl + H_2O_2$ | $CHF_3$ | 100/40 | 3.0 |

TABLE 10-continued

| Example | Resist | Principal Resist Change | Developing Solution | Dry Etching Gas | Opening Width/Depth (nm) | Aspect Ratio |
|---|---|---|---|---|---|---|
| 15 | $Ga_{50}Sb_{50}$ | Phase Change | HCl | $CHF_3$ | 100/40 | 3.0 |
| 15 | $Ni_{50}Bi_{50}$ | Oxidation | $HNO_3$ | $CF_4$ | 100/40 | 3.0 |
| 15 | $Ni_{70}Bi_{30}$ | Oxidation | $HNO_3$ | $CF_4$ | 100/40 | 3.0 |
| 15 | $Zn_{50}Te_{50}$ | Phase Change | KOH | $CHF_3$ | 175/40 | 1.7 |
| 15 | $Cu_{13.6}V_{86.4}$ | Oxidation | $HCl + H_2O_2$ | $CF_4$ | 175/40 | 1.7 |
| 15 | $Zn_{32}Sb_{68}$ | Phase Change | $H_2SO_4$ | $CHF_3$ | 175/40 | 1.7 |
| 15 | $Bi_{10}Te_{90}$ | Oxidation | HCl | $CHF_3$ | 175/40 | 1.7 |
| 15 | $Sn_{74}Pb_{26}$ | Oxidation | KOH | $CF_4$ | 175/40 | 1.7 |
| 15 | $Sn_{25}Pb_{75}$ | Oxidation | KOH | $CF_4$ | 175/40 | 1.7 |
| 15 | $Sn_{50}Sb_{50}$ | Oxidation | HCl | $CF_4$ | 175/40 | 1.7 |

INDUSTRIAL APPLICABILITY

The heat-reactive resist material according to the invention has high resistance to dry etching using fluorocarbons, thereby functions as a mask to form deep grooves, and thus enables formation of a pattern shape with deep grooves. In other words, it is possible to select the aspect ratio freely, and the diversity of optical design is widened.

The invention claimed is:

1. A heat-reactive resist material used in dry etching using fluorocarbons, the heat-reactive resist material comprising at least one kind of an element such that the boiling point of a primary fluoride is 200° C. or more, wherein
the heat-reactive resist material comprises any one of a decomposable oxide, a decomposable nitride, a decomposable carbide, a decomposable carbon oxide, a decomposable sulfide, and a decomposable selenide,
the decomposable oxide is any one of CuO, $Co_3O_4$, $MnO_2$, $Mn_2O_3$, $Cro_3$, $Cr_5O_{12}$, $PbO_2$, $Pb_3O_4$, $TaO_2$, $Rh_2O_3$, $RuO_2$, $MgO_2$, $CaO_2$, $BaO_2$, and $ZnO_2$,
the decomposable carbide is any one of $NdC_2$ and $Al_4C_3$,
the decomposable carbon oxide is any one of $MgCO_3$, $CaCO_3$, $SrCO_3$, $BaCO_3$, $ZnCO_3$, $CdCO_3$, $Ag_2CO_3$, $PbCO_3$, and $NiCO_3$,
the decomposable nitride is any one of $Zn_3N_2$, CrN, $Cu_3N$, $Fe_2N$, and $Mg_3N_2$,
the decomposable sulfide is any one of CuS, $Ni_3S_4$, FeS, $FeS_2$, $Fe_2S_3$, $SnS_2$, $HfS_2$, $TiS_2$, $Rh_2S_2$, $RuS_2$, $Bi_2S_3$, $Cr_2S_3$, GaS, $BaS_3$, $MnS_2$ and $Nd_2S_3$, and
the decomposable selenide is any one of CuSe, $Bi_2Se_3$, FeSe, and GaSe.

2. The heat-reactive resist material according to claim 1, wherein both an area in which heat reaction occurs and another area in which heat reaction does not occur are provided inside a spot diameter of a laser.

3. The heat-reactive resist material according to claim 1, wherein a pattern is capable of being formed by decomposition.

4. The heat-reactive resist material according to claim 1, wherein the decomposable oxide is any one of CuO, $Co_3O_4$, $MnO_2$, $Mn_2O_3$, $CrO_3$, $Cr_5O_{12}$, $PbO_2$, $Pb_3O_4$, $MgO_2$, $CaO_2$, $BaO_2$, and $ZnO_2$, the decomposable carbon oxide is any one of $MgCO_3$, $CaCO_3$, $SrCO_3$ and $BaCO_3$, the decomposable sulfide is any one of CuS, $FeS_2$, $SnS_2$, and $HfS_2$, and the decomposable selenide is CuSe.

5. The heat-reactive resist material according to claim 4, wherein the decomposable oxide is any one of CuO, $Co_3O_4$, $MnO_2$, $Mn_2O_3$, $CrO_3$, $Pb_3O_4$, $BaO_2$, and $CaCO_3$, the decomposable sulfide is any one of $FeS_2$ and $SnS_2$, and the decomposable selenide is CuSe.

6. The heat-reactive resist material according to claim 1, wherein the heat-reactive resist material further contains at least one element selected from the group consisting of Al, Si, Ti, V, Cr, Mn, Fe, Co, Ni, Cu, Mo, Zr, Zn, Ga, Ru, Pd, Ag, Cd, Hf, Ta, W, Pt, Au, C and B.

7. A heat-reactive resist material used in dry etching using fluorocarbons, the heat-reactive resist material comprising at least one kind of an element such that the boiling point of a primary fluoride is 200° C. or more, wherein
the heat-reactive resist material comprises any one of a fusible composite metal material, a phase-change composite metal material, and an oxidizing composite metal material, and
the fusible composite metal material, the phase-change composite metal material, and the oxidizing composite metal material contain two kinds of metals selected from the metal group (α) consisting of Mg, Ca, Sr, Ba, Sc, Y, Ti, Zr, Hf, Nb, Ta, Cr, Mn, Fe, Co, Ni, Cu, Ag, Zn, Al, Ga, In, Sn, Pb, Sb and Bi and the metal group (β) consisting of V, Mo, W, Ge, Se and Te, and at least one kind in the metals is selected from the metal group (α).

8. The heat-reactive resist material according to claim 7, wherein the fusible composite metal material, the phase-change composite metal material, and the oxidizing composite metal material contain two kinds of metals selected from the metal group (γ) consisting of Mg, Ti, Zr, Nb, Ta, Cr, Mn, Fe, Co, Ni, Cu, Ag, Zn, Al, Ga, In, Pb, Sb and Bi and the metal group (δ) consisting of V, Mo, W, Ge, and Te, and at least one kind in the metals is selected from the metal group (γ).

9. The heat-reactive resist material according to claim 7, wherein the heat-reactive resist material contains any one of combinations of metals represented by In—Sb, Sn—Sb, Cr—Sb, Ga—Sb, In—Sn, Ni—Sn, Al—Sn, Bi—Sn, Sn—Pb, Ni—Bi, Zn—Sb, Ni—Cr, Ni—Nb, Al—Ni, Cu—Zr, Ag—Zn, Ge—Sb, Sb—Te, Bi—Te, Ni—W, Zn—Te, Pb—Te, Mo—Nb, W—Nb, Cr—Mo and Cu—V.

10. The heat-reactive resist material according to claim 9, wherein the heat-reactive resist material contains any one of $In_5Sb_{95}$, $In_{32}Sb_{68}$, $In_{68}Sb_{32}$, $In_1Sb_{99}$, $Sn_{50}Sb_{50}$, $Cr_{50}Sb_{50}$, $Ga_{50}Sb_{50}$, $Ga_{40}Sb_{60}$, $Ga_{30}Sb_{70}$, $Ga_{20}Sb_{80}$, $Ga_{12}Sb_{88}$, $Ga_{10}Sb_{90}$, $In_{47}Sn_{53}$, $In_{53}Sn_{47}$, $Ni_{80.7}Sn_{19.3}$, $Al_{2.2}Sn_{97.8}$, $Bi_{43}Sn_{57}$, $Sn_{26}Pb_{74}$, $Sn_{25}Pb_{75}$, $Sn_{74}Pb_{26}$, $Ni_{50}Bi_{50}$, $Ni_{40}Bi_{60}$, $Ni_{60}Bi_{40}$, $Ni_{70}Bi_{30}$, $Ni_{80}Bi_{20}$, $Ni_{90}Bi_{10}$, $Zn_{32}Sb_{68}$, $Ni_{50}Cr_{50}$, $Ni_{83.8}Nb_{16.2}$, $Ni_{59.8}Nb_{40.2}$, $Al_{97.3}Ni_{2.7}$, $Cu_{90.6}Zr_{9.4}$, $Ag_{70}Zn_3$, $Ge_{10}Sb_{90}$, $Ge_{20}Sb_{80}$, $Ge_{30}Sb_7$, $Ge_{50}Sb_{50}$, $Bi_{90}Te_{10}$, $Bi_{97}Te_3$, $Ni_{81}W_{19}$, $Zn_{50}Te_{50}$, $Pb_{50}Te_{50}$, $Mo_{40}Nb_{60}$, $Mo_{50}Nb_{50}$, $W_{40}Nb_{60}$, $W_{50}Nb_{50}$, and $Cr_{85}Mo_{15}$.

11. The heat-reactive resist material according to claim 9, wherein the heat-reactive resist material contains any one of $Sb_{40}Te_{60}$, $Bi_{10}Te_{90}$, $Cu_{8.6}V_{91.4}$, $Cu_{13.6}V_{86.4}$, and $Cu_{18.6}V_{81.4}$.

12. The heat-reactive resist material according to claim 7, wherein the heat-reactive resist material contains at least an intermetallic compound or a eutectic state.

13. A heat-reactive resist material used in dry etching using fluorocarbons, the heat-reactive resist material comprising at least one kind of an element such that the boiling point of a primary fluoride is 200° C. or more, wherein the heat-reactive resist material is any one of $Mn_2O_3$, CuO, $Co_3O_4$, $Pb_3O_4$, $BaO_2$, $CaCO_3$, $FeS_2$, and $SnS_2$.

14. A layered product for thermal lithography, comprising:
a heat-reactive resist layer containing mainly the heat-reactive resist material according to claim 1; and
an etching layer provided on the heat-reactive resist layer, wherein an etching material constituting the etching layer contains at least one or more kinds of elements such that the boiling point of the primary fluoride is 250° C. or less, and the boiling point of the primary fluoride of a main element constituting the heat-reactive resist material is higher than the boiling point of the primary fluoride of a main element constituting the etching material.

15. The layered product for thermal lithography according to claim 14, wherein the etching material is a material selected from the group consisting of Ta, Mo, W, C, Si, Ge, Te and P, complexes of two or more kinds thereof, their oxides, their nitrides, their sulfides, and their carbon oxides.

16. The layered product for thermal lithography according to claim 14, wherein the etching material is a material selected from the group consisting of Ta, Si, Ge and P, their oxides, their nitrides, their sulfides, their carbon oxides, and silicide of Mo and W.

17. The layered product for thermal lithography according to claim 14, wherein the etching material is a material selected from the group consisting of Ta, Si, Ge and P, their oxides, and their nitrides.

18. The layered product for thermal lithography according to claim 14, wherein the etching material is a material selected from the group consisting of $SiO_2$, Si and $Si_3N_4$.

19. A method of manufacturing a mold, including:
a step (1) of providing an etching layer comprised of the etching material used in the layered product for thermal lithography according to claim 14 on a substrate, and further depositing a resist layer comprised of said heat-reactive resist material on the etching layer to form a layered film;
a step (2) of exposing the heat-reactive resist layer of the layered film, and then developing;
a step (3) of subsequently performing dry etching on the etching layer with fluorocarbons using the heat-reactive resist layer as a mask; and
a step (4) of removing the heat-reactive resist to manufacture a mold.

20. The method of manufacturing a mold according to claim 19, wherein deposition in the step (1) is performed by a sputtering method, vapor deposition method, or CVD method.

21. The method of manufacturing a mold according to claim 19, wherein the substrate is in the shape of a flat plate.

22. The method of manufacturing a mold according to claim 19, wherein the substrate is in the shape of a sleeve.

23. The method of manufacturing a mold according to claim 19, wherein exposure in the step (2) is performed using a semiconductor laser.

24. A heat-reactive resist material used in dry etching using fluorocarbons, the heat-reactive resist material comprising at least one kind of an element such that the boiling point of a primary fluoride is 200° C. or more, wherein the heat-reactive resist material is any one of $Cr_{1-x}O_x$ (X=0.24), $Nb_{1-x}O_x$ (X=0.11), $Ta_{1-x}O_x$ (X=0.17), $Ti_{1-x}O_x$ (X=0.18), $Sn_{1-x}O_x$ (X=0.1), and $Pb_{1-x}O_x$ (X=0.21).

25. A heat-reactive resist material used in dry etching using fluorocarbons, the heat-reactive resist material comprising at least one kind of an element such that the boiling point of a primary fluoride is 200° C. or more, wherein the heat-reactive resist material is any one of $Bi_{97}Te_3$, $Sb_{40}Te_{60}$, $Ge_{20}Sb_{80}$, $In_{32}Sb_{68}$, $In_5Sb_{95}$, $Mo_{50}Nb_{50}$, $Ga_{50}Sb_{50}$, $Ni_{50}Bi_{50}$, $Ni_{70}Bi_{30}$, $Zn_{50}Te_{50}$, $CU_{13.6}V_{86.4}$, and $Zn_{32}Sb_{68}$.

26. A heat-reactive resist material used in dry etching using fluorocarbons, the heat-reactive resist material comprising any one of a decomposable oxide, a decomposable nitride, a decomposable carbide, a decomposable carbon oxide, a decomposable sulfide, and a decomposable selenide, wherein
the decomposable oxide is an oxide of an element selected from groups II, V, VI, VII, VIII, IX, XI, XII and XIV except Ag, Au and Pd,
the decomposable nitride is a nitride of an element selected from groups II, VI, VIII, XI and XII except Ag and Au,
the decomposable carbide, the decomposable carbon oxide, the decomposable sulfide, and the decomposable selenide are compounds selected from a carbide, a carbon oxide, a sulfide and a selenide of an element selected from groups II to IX and groups XI to XV, and
the boiling point of a primary fluoride of the element is 200° C. or more.

27. The heat-reactive resist material according to claim 26, wherein the decomposable oxide is an oxide of an element selected from groups II, V, VI, VII, VIII, IX, XI and XII except Ag, Au and Pd.

28. The heat-reactive resist material according to claim 26, wherein both an area in which heat reaction occurs and another area in which heat reaction does not occur are provided inside a spot diameter of a laser.

29. The heat-reactive resist material according to claim 26, wherein a pattern is capable of being formed by decomposition.

30. The heat-reactive resist material according to claim 26, wherein the heat-reactive resist material further contains at least one element selected from the group consisting of Al, Si, Ti, V, Cr, Mn, Fe, Co, Ni, Cu, Mo, Zr, Zn, Ga, Ru, Pd, Ag, Cd, Hf, Ta, W, Pt, Au, C and B.

31. A heat-reactive resist material used in dry etching using fluorocarbons, the heat-reactive resist material comprising an imperfect oxide, wherein
the imperfect oxide is an imperfect oxide of an element selected from the group consisting of transition metals and group XII to XV, and
the boiling point of a primary fluoride of the element is 200° C. or more.

32. The heat-reactive resist material according to claim 31, wherein both an area in which heat reaction occurs and another area in which heat reaction does not occur are provided inside a spot diameter of a laser.

33. The heat-reactive resist material according to claim 31, wherein a pattern is capable of being formed by oxidation.

34. The heat-reactive resist material according to claim 31, wherein the imperfect oxide is an imperfect oxide of an element selected from the group consisting of Ti, Cr, Mn, Fe, Co, Ni, Cu, Zr, Nb, Rh, Ag, Hf, Ta, Au, Al, Zn, Ga, In, Sn, Sb, Pb and Bi.

35. The heat-reactive resist material according to claim 34, wherein the imperfect oxide is an imperfect oxide of an element selected from the group consisting of Ti, Cr, Mn, Co, Cu, Nb, Ag, Ta, Au, Sn, Pb and Bi.

36. The heat-reactive resist material according to claim 31, wherein the heat-reactive resist material further contains at least one element selected from the group consisting of Al, Si, Ti, V, Cr, Mn, Fe, Co, Ni, Cu, Mo, Zr, Zn, Ga, Ru, Pd, Ag, Cd, Hf, Ta, W, Pt, Au, C and B.

* * * * *